(12) United States Patent
Doshida et al.

(10) Patent No.: US 7,923,898 B2
(45) Date of Patent: Apr. 12, 2011

(54) PIEZO DRIVE SYSTEM

(75) Inventors: Yutaka Doshida, Takasaki (JP); Taisei Irieda, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 342 days.

(21) Appl. No.: 12/265,676

(22) Filed: Nov. 5, 2008

(65) Prior Publication Data
US 2009/0309457 A1 Dec. 17, 2009

(30) Foreign Application Priority Data

Nov. 8, 2007 (JP) ................................. 2007-291385
Aug. 6, 2008 (JP) ................................. 2008-203657

(51) Int. Cl.
*H02N 2/00* (2006.01)
(52) U.S. Cl. ......... 310/323.09; 310/323.03; 310/323.04; 310/323.12; 310/323.13; 310/328
(58) Field of Classification Search ............ 310/323.01–323.04, 323.08, 323.09, 323.12–323.14, 323.16–323.19, 310/328
See application file for complete search history.

(56) References Cited

U.S. PATENT DOCUMENTS

| | | | | |
|---|---|---|---|---|
| 3,904,896 A | * | 9/1975 | Guntersdorfer | 310/318 |
| 4,697,117 A | * | 9/1987 | Mishiro | 310/323.12 |
| 5,001,382 A | * | 3/1991 | Umeda et al. | 310/328 |
| 5,205,147 A | * | 4/1993 | Wada et al. | 72/429 |
| 5,351,789 A | * | 10/1994 | Tochihara et al. | 188/67 |
| 5,828,156 A | * | 10/1998 | Roberts | 310/317 |
| 5,994,818 A | * | 11/1999 | Abramov et al. | 310/325 |
| 7,105,985 B2 | * | 9/2006 | Beck et al. | 310/323.19 |
| 7,312,559 B2 | * | 12/2007 | Lee et al. | 310/367 |
| 2005/0253483 A1 | * | 11/2005 | Okamoto | 310/323.13 |
| 2009/0120967 A1 | * | 5/2009 | Bensley | 222/333 |

FOREIGN PATENT DOCUMENTS

| | | |
|---|---|---|
| JP | A-03-074180 A1 | 3/1991 |
| JP | A-11-018447 A1 | 1/1999 |
| JP | A-11-044899 A1 | 2/1999 |
| JP | A-11-075382 A1 | 3/1999 |
| JP | A-2000-019376 A1 | 1/2000 |
| JP | A-2003-141827 A1 | 5/2003 |
| JP | A-2003-317410 A1 | 11/2003 |
| JP | A-2004-056951 A1 | 2/2004 |
| JP | A-2007-215395 A1 | 8/2007 |
| JP | A-04-069070 A1 | 3/2009 |

* cited by examiner

*Primary Examiner* — Thomas M Dougherty
(74) *Attorney, Agent, or Firm* — Law Office of Katsuhiro Arai

(57) ABSTRACT

A piezo drive system includes an elastic fixing frame, a drive element, a rod, and a rotor. A vamplate portion is formed on the outer surface of the rod. One end of the rod is secured to around the center of a face of the drive element. The rotor consists of a cylindrical portion and a disk portion, and can rotate relative to the rod. Protrusions are formed on the inside of a top surface portion of the fixing frame to push against the disk portion. Using the drive element, the rod rotates while tilting and makes a surface contact with the vamplate portion, producing friction. Consequently, the rotor is rotated.

18 Claims, 26 Drawing Sheets

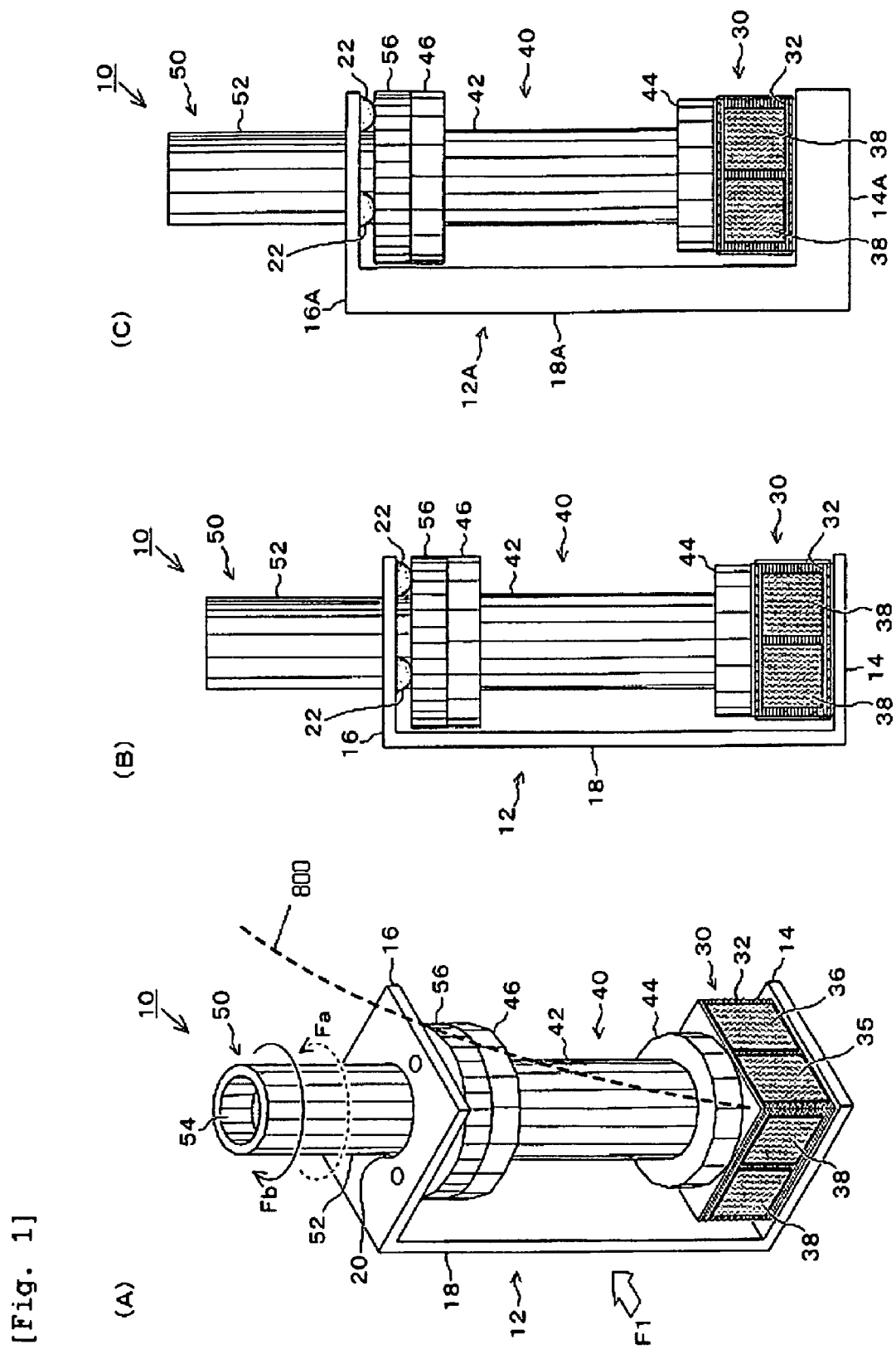

[Fig. 2]
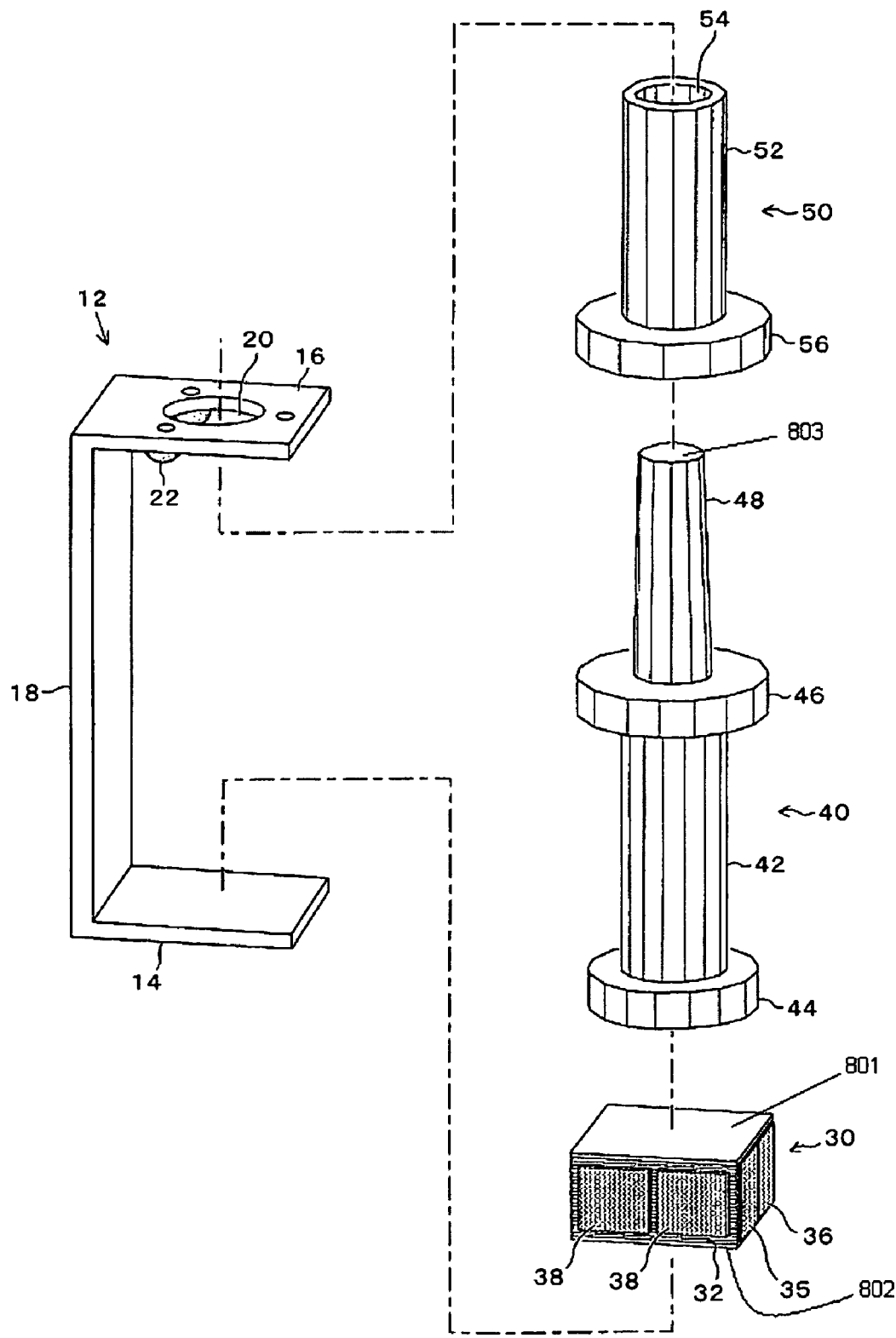

[Fig. 3]
(A)
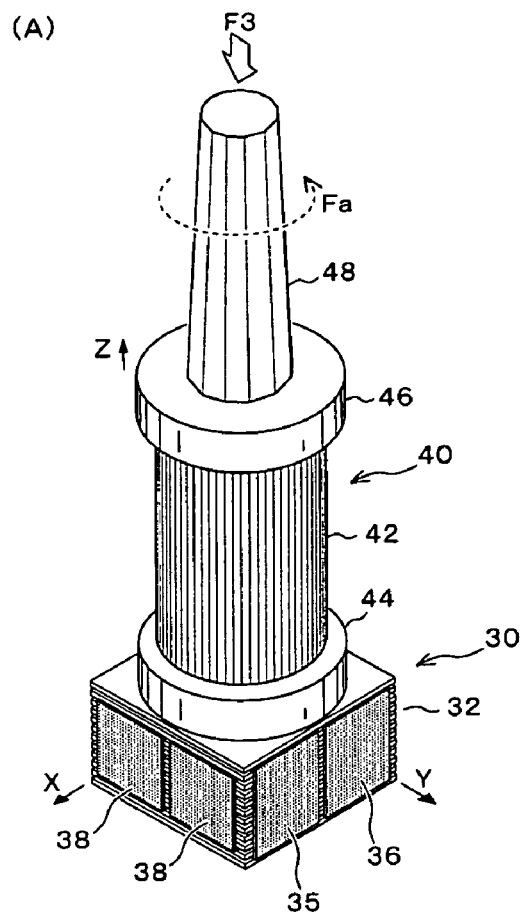
(B)
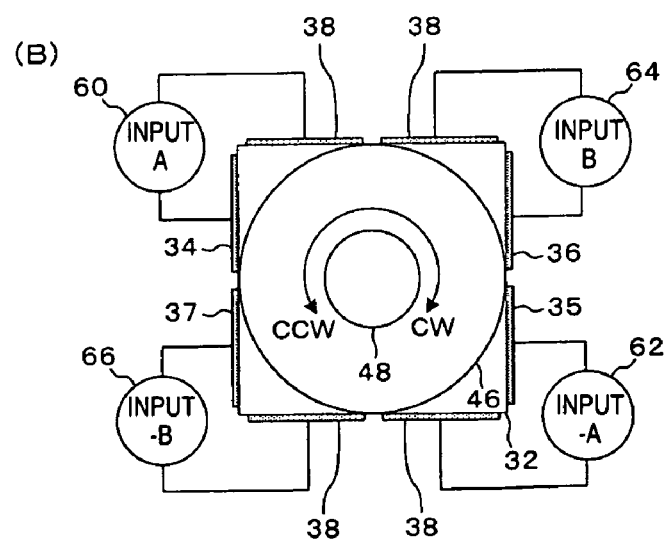

[Fig. 4]
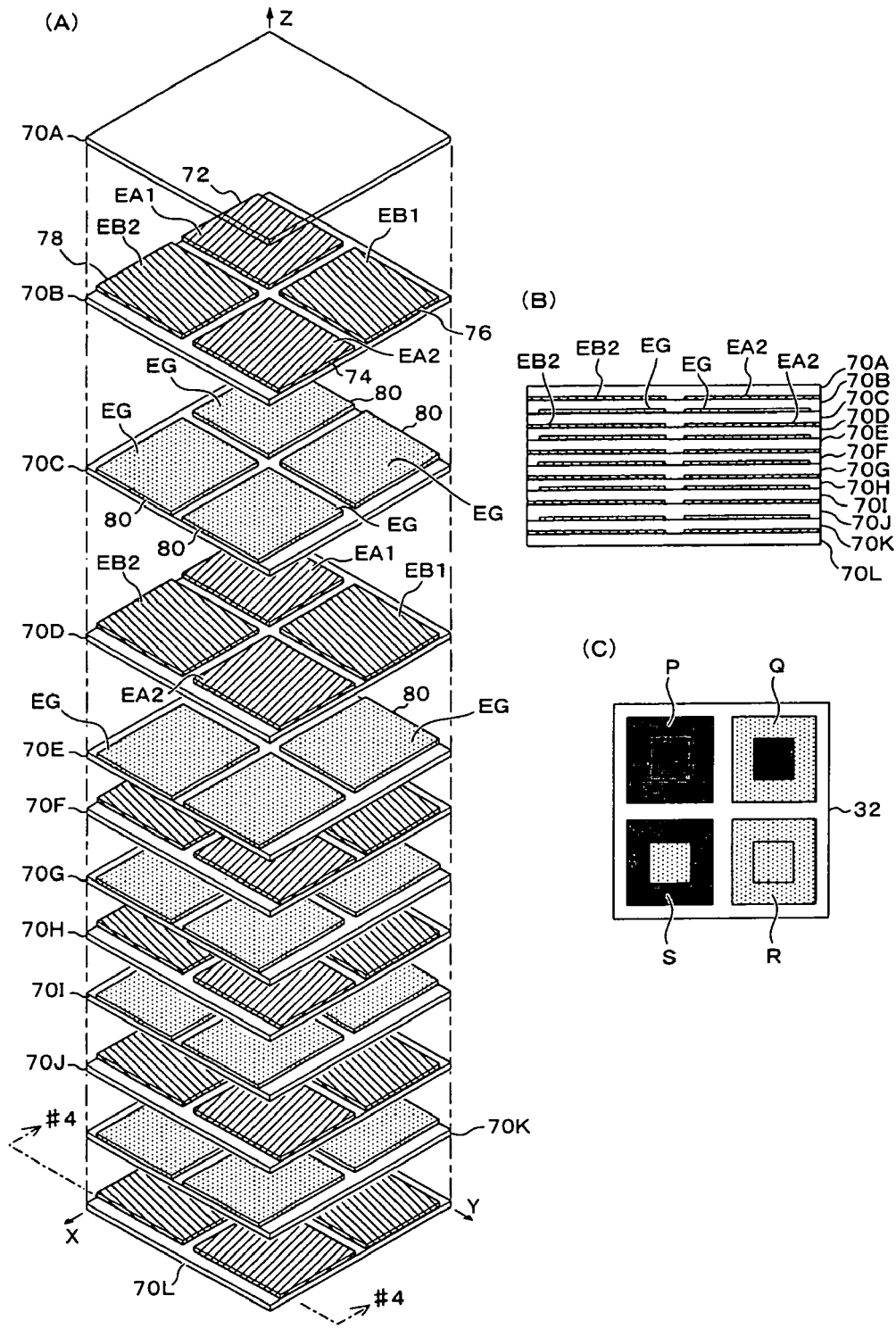

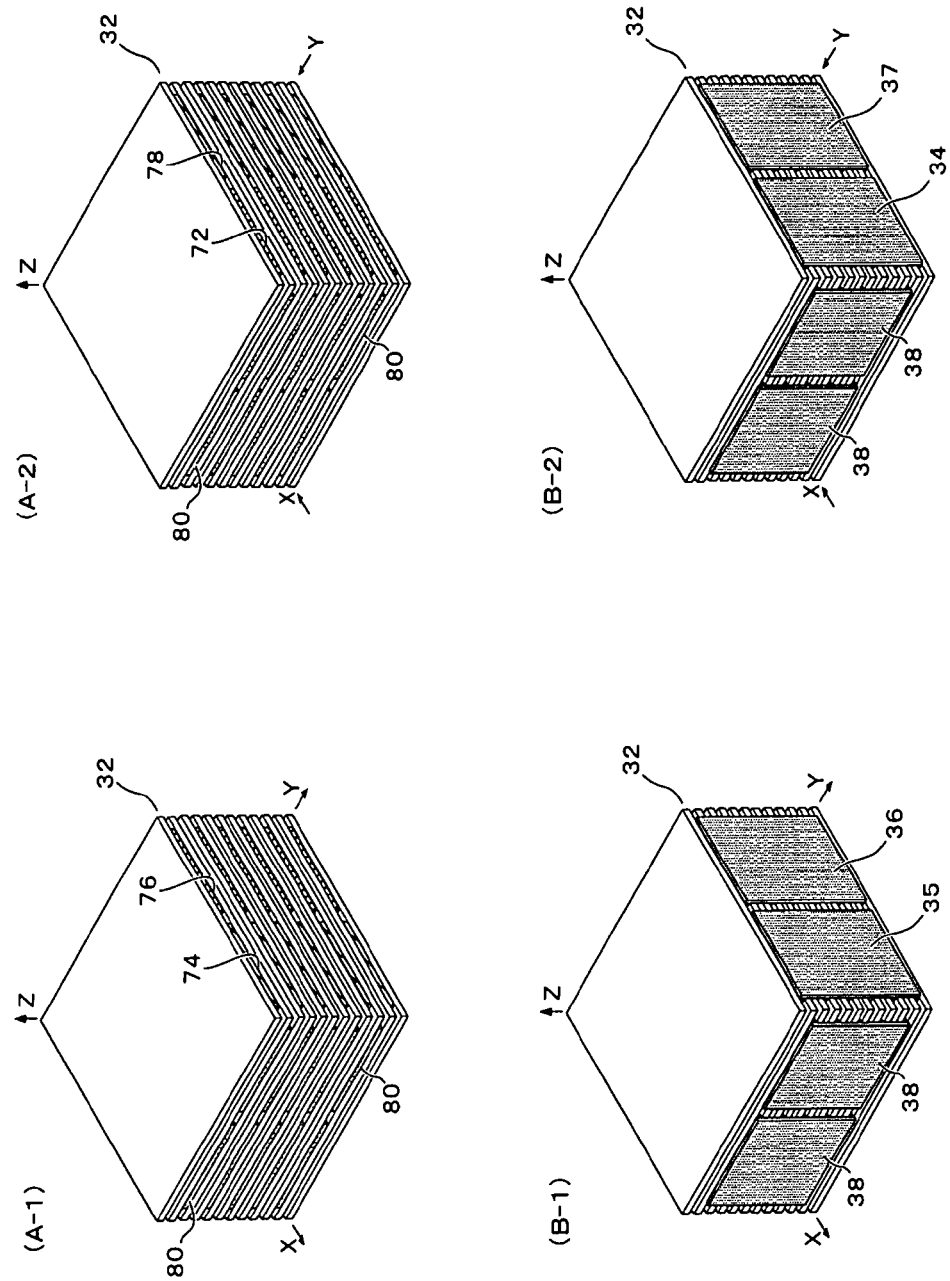
[Fig. 5]

[Fig. 6]
(A)
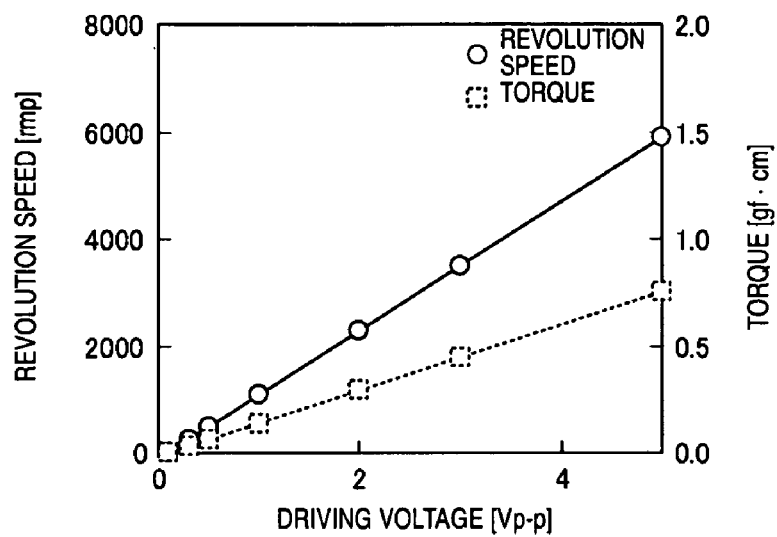
(B)
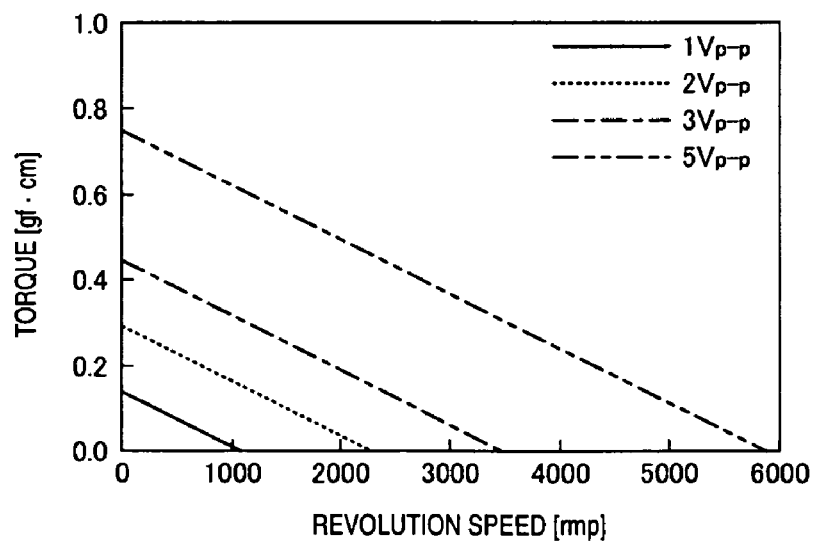

[Fig. 7]
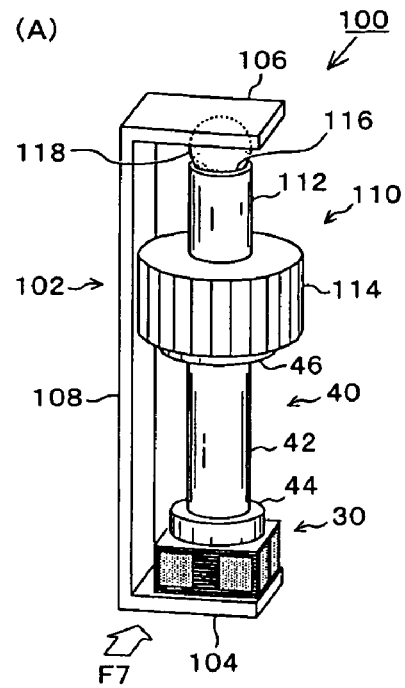
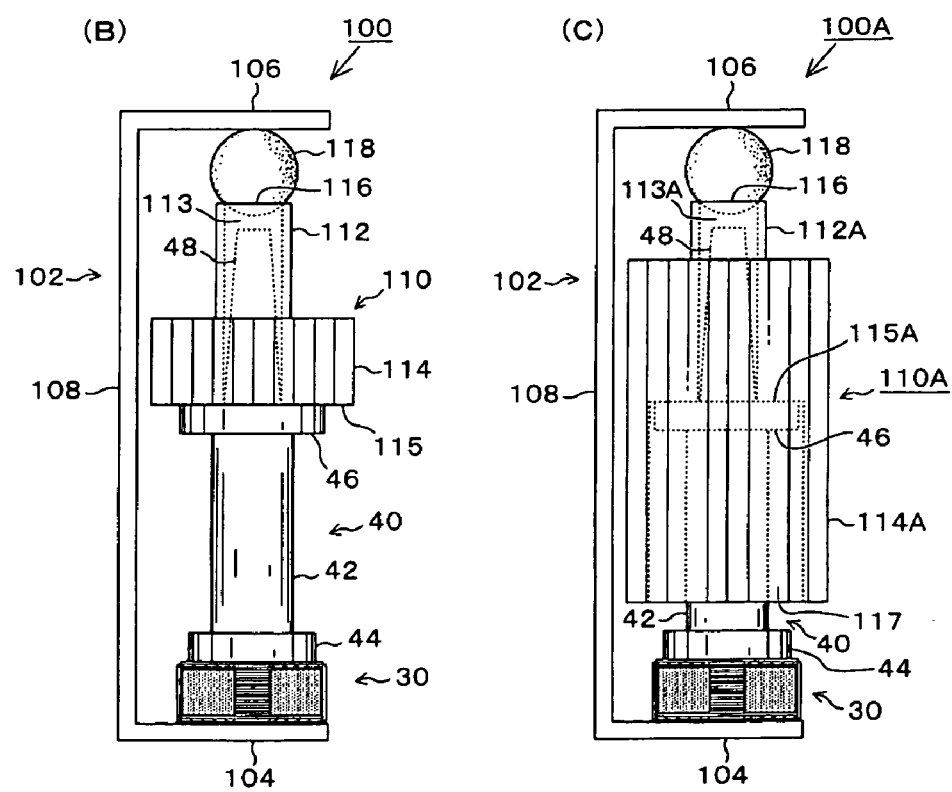

[Fig. 8]
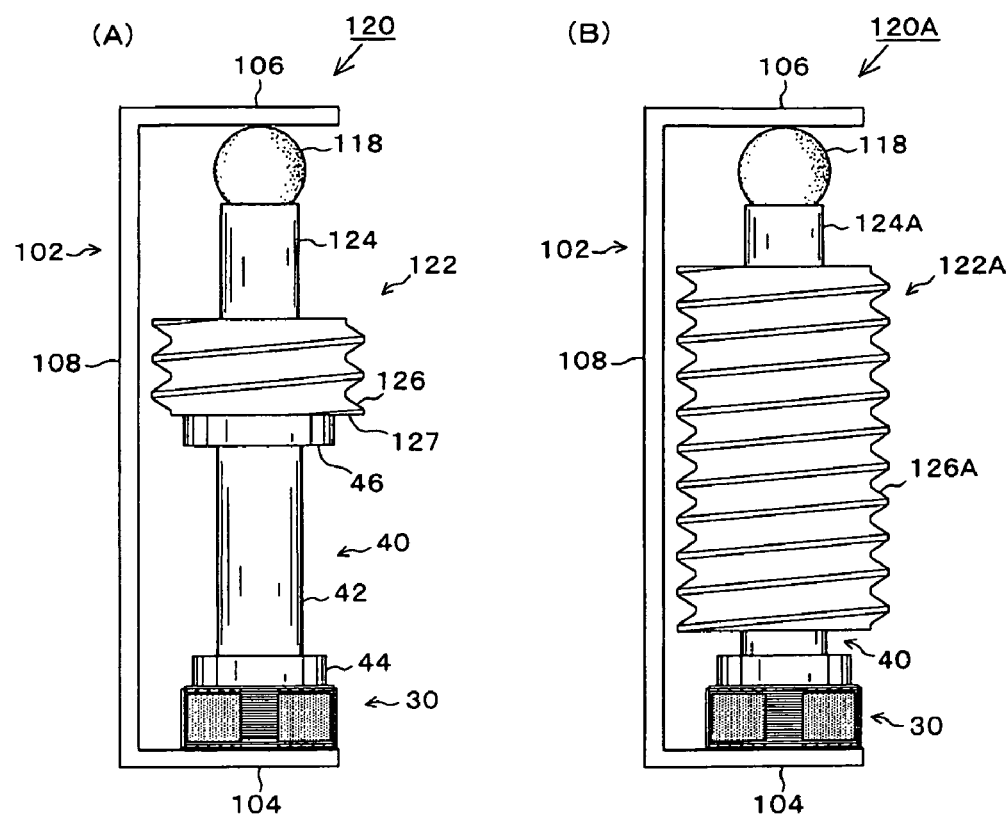

[Fig. 9]
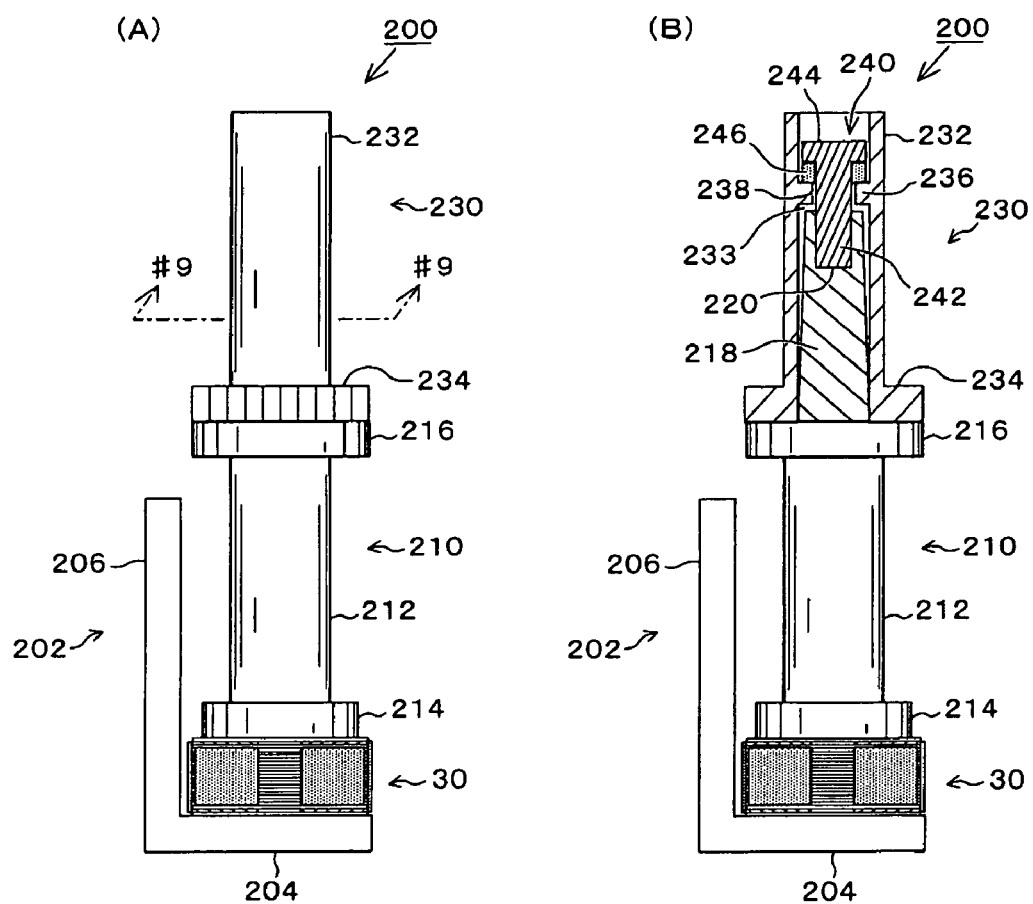

[Fig. 10]
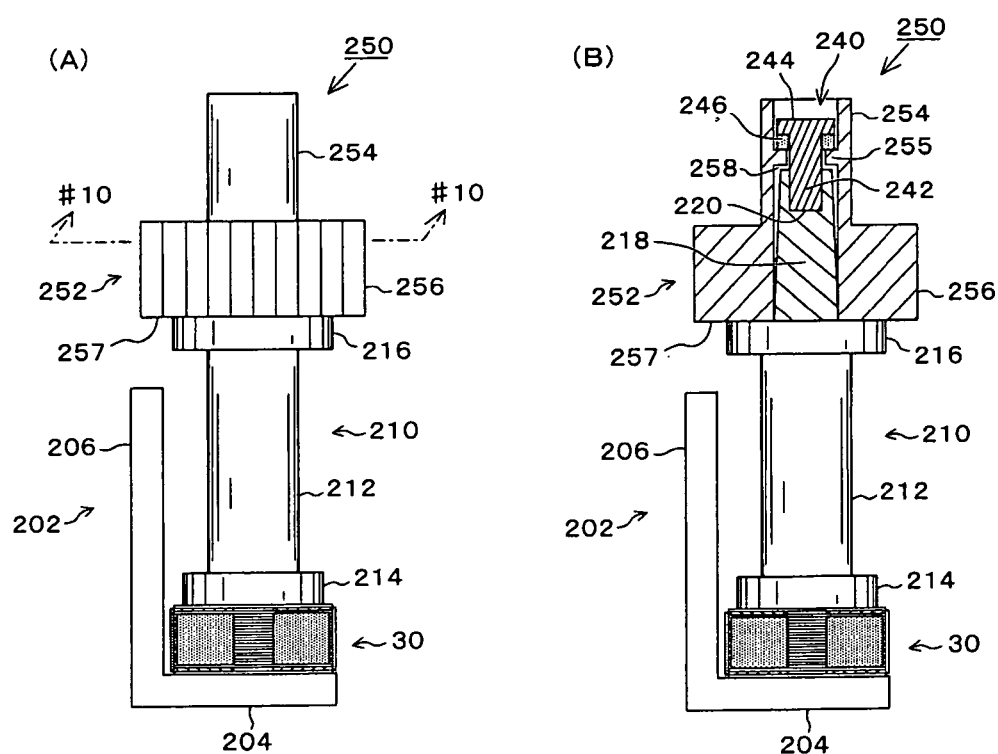

[Fig. 11]
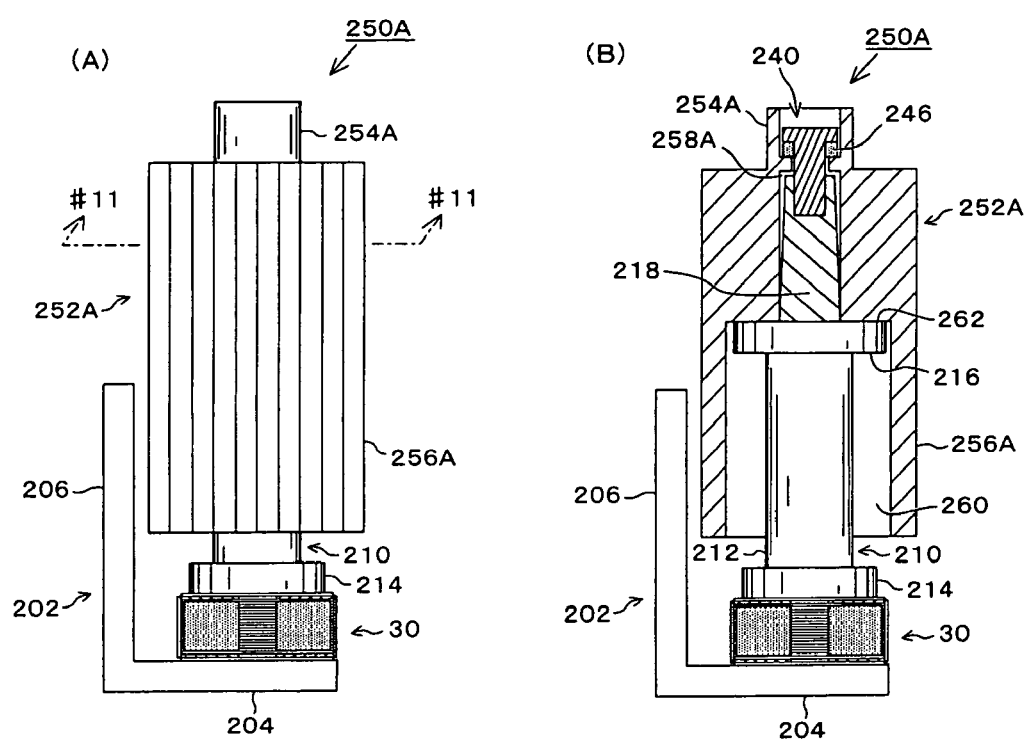

[Fig. 12]
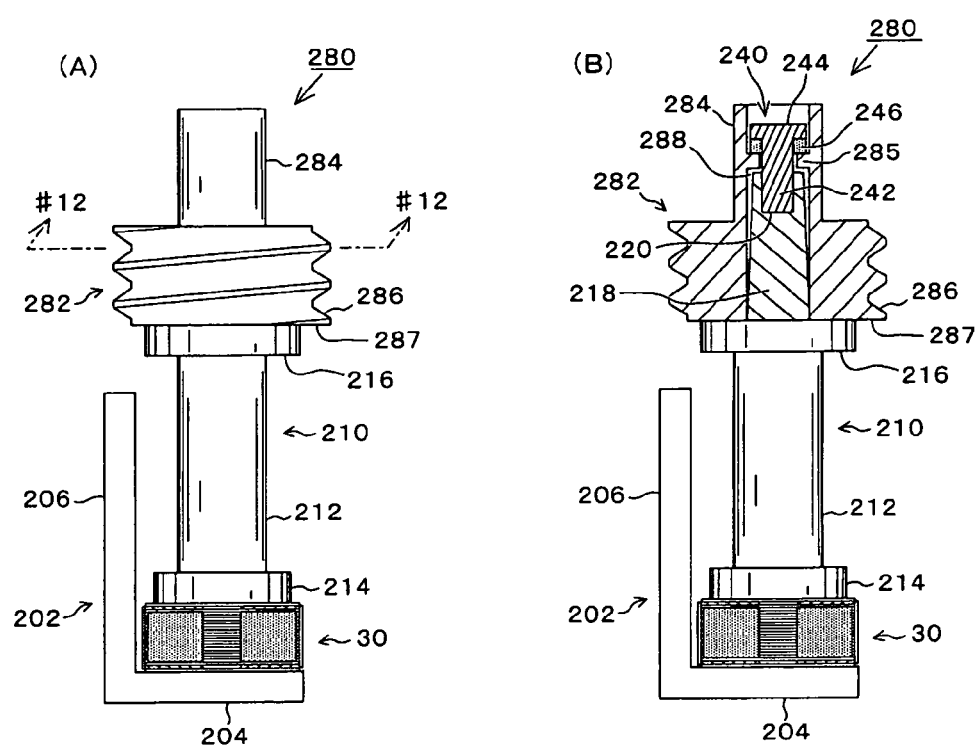

[Fig. 13]
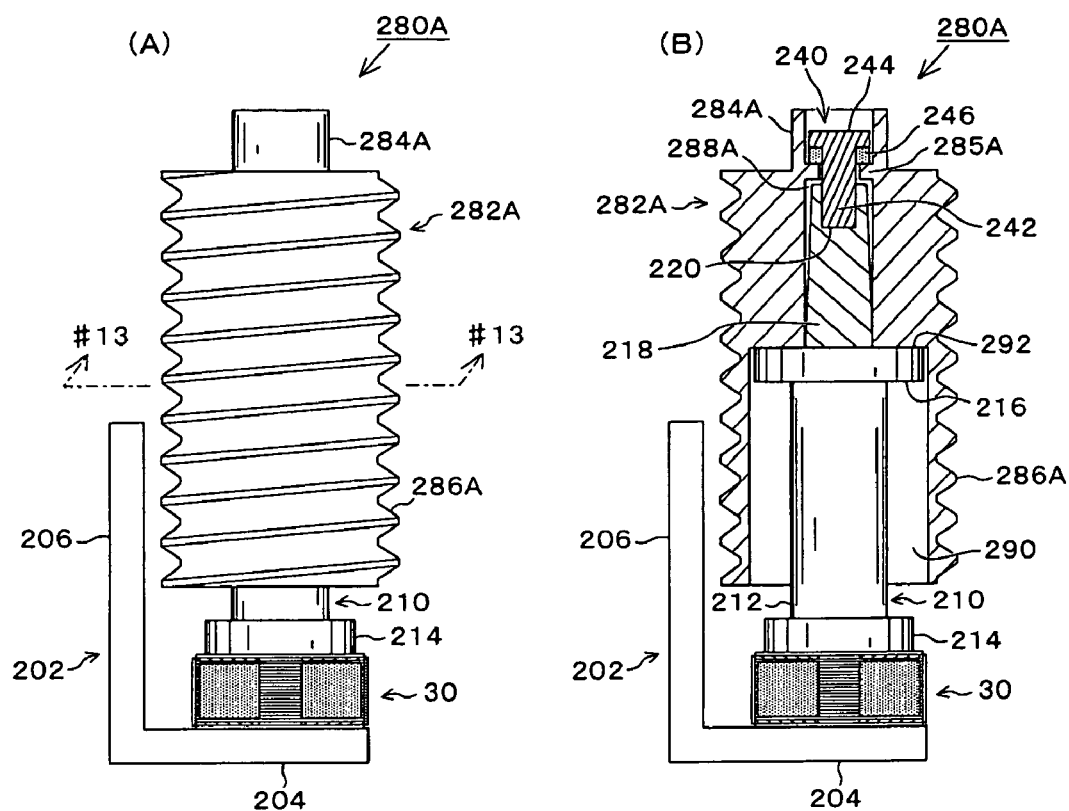

[Fig. 14]
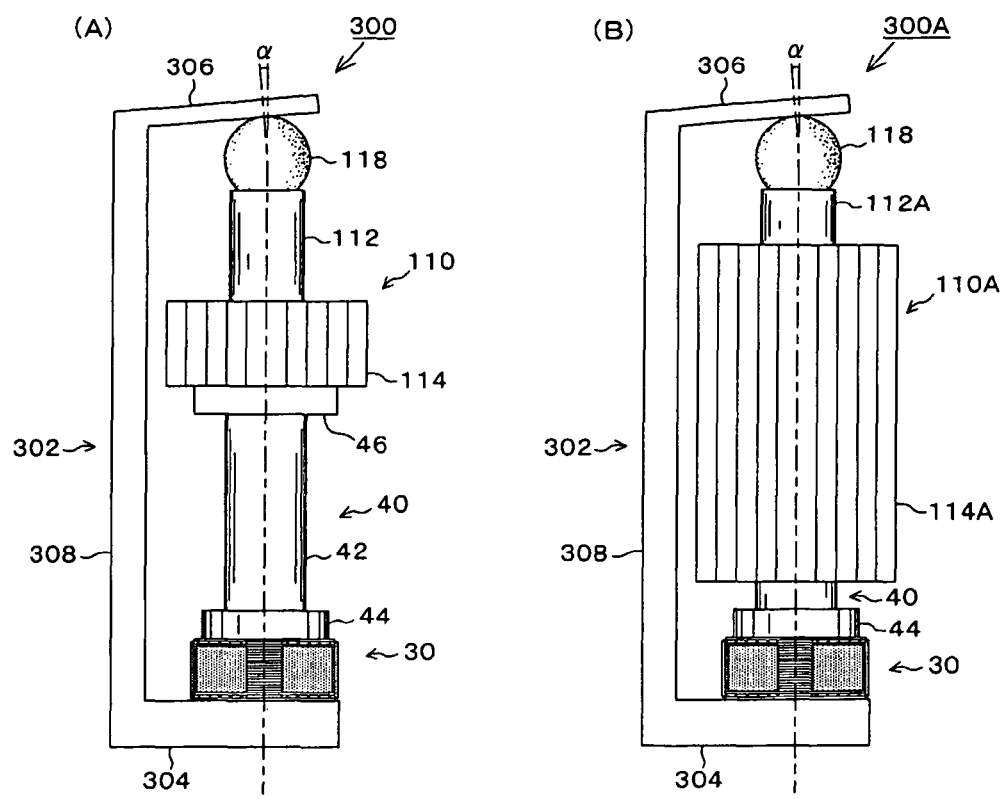

[Fig. 15]
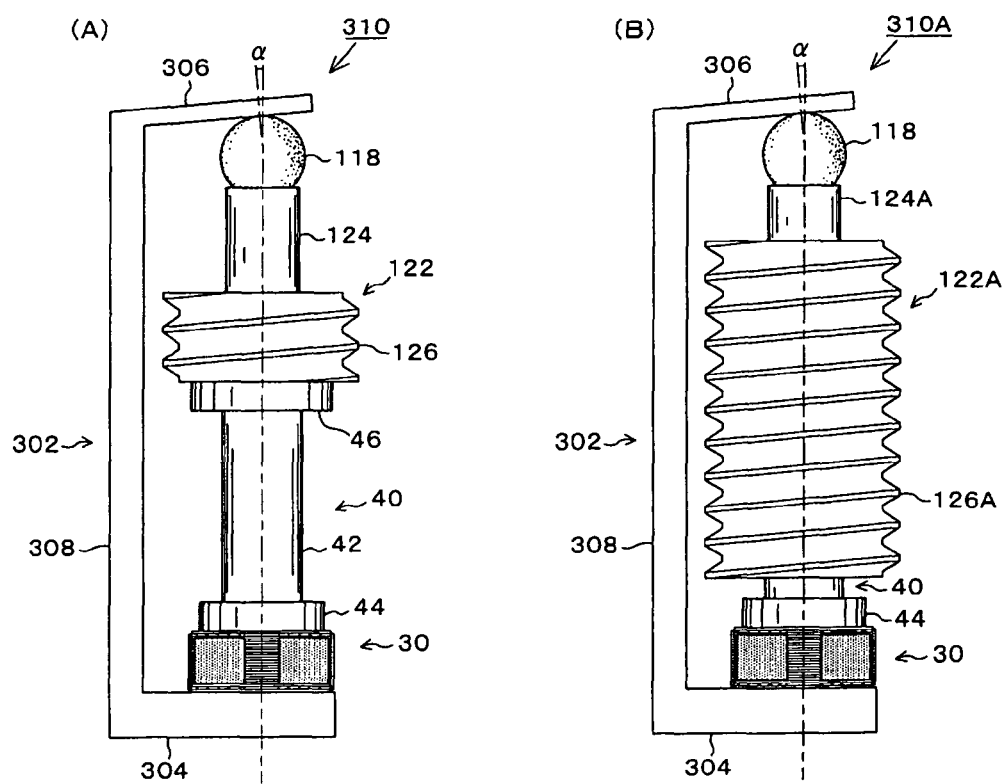

[Fig. 16]
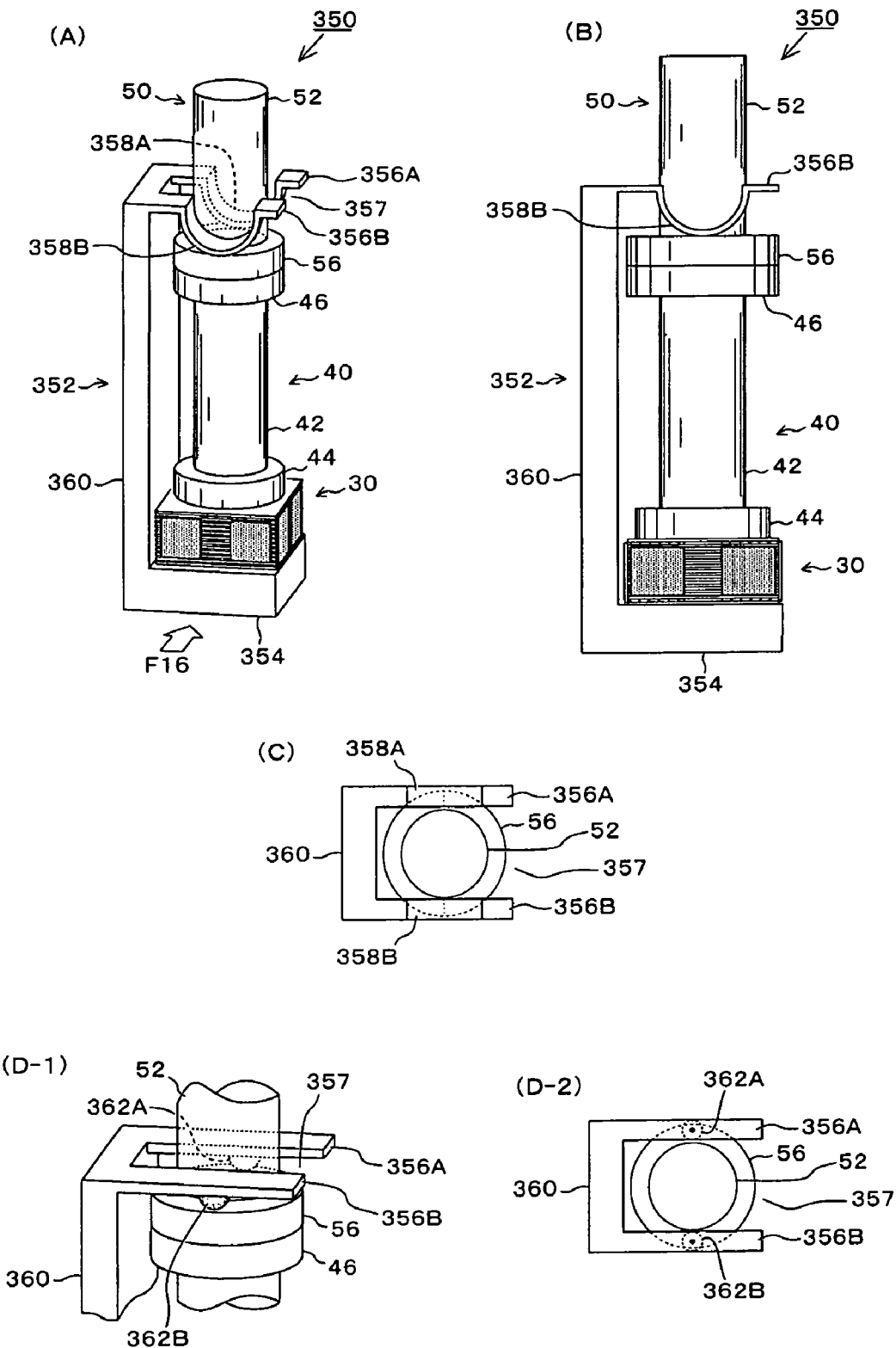

[Fig. 17]
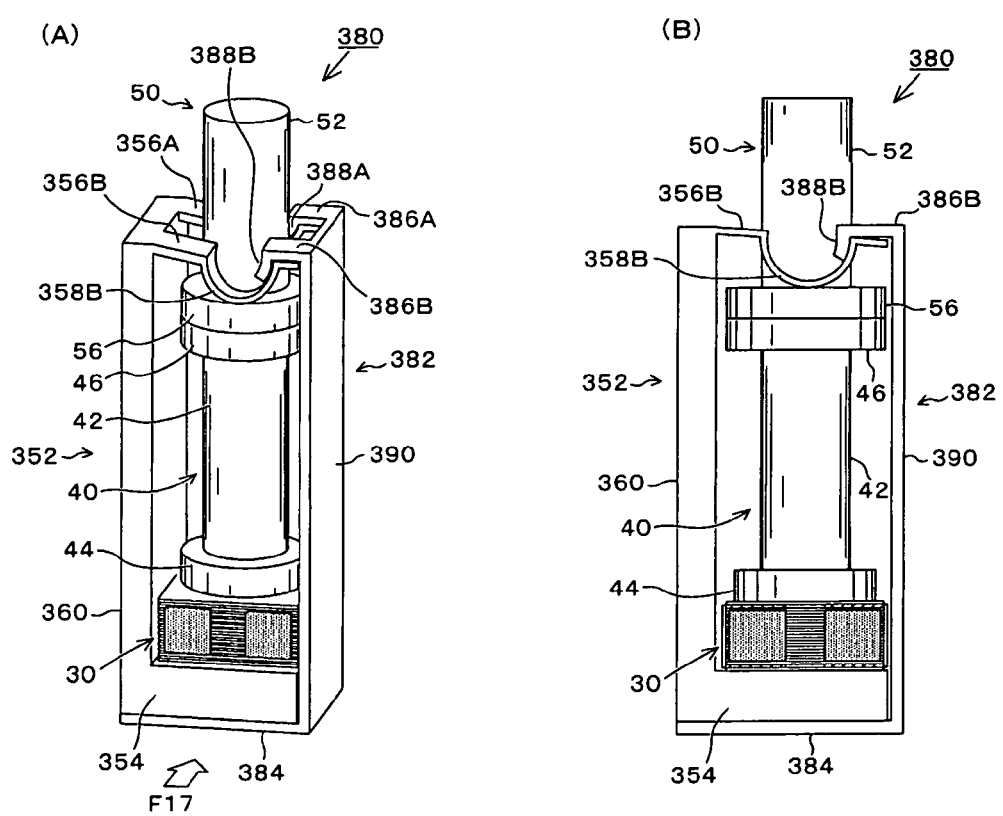

[Fig. 18]
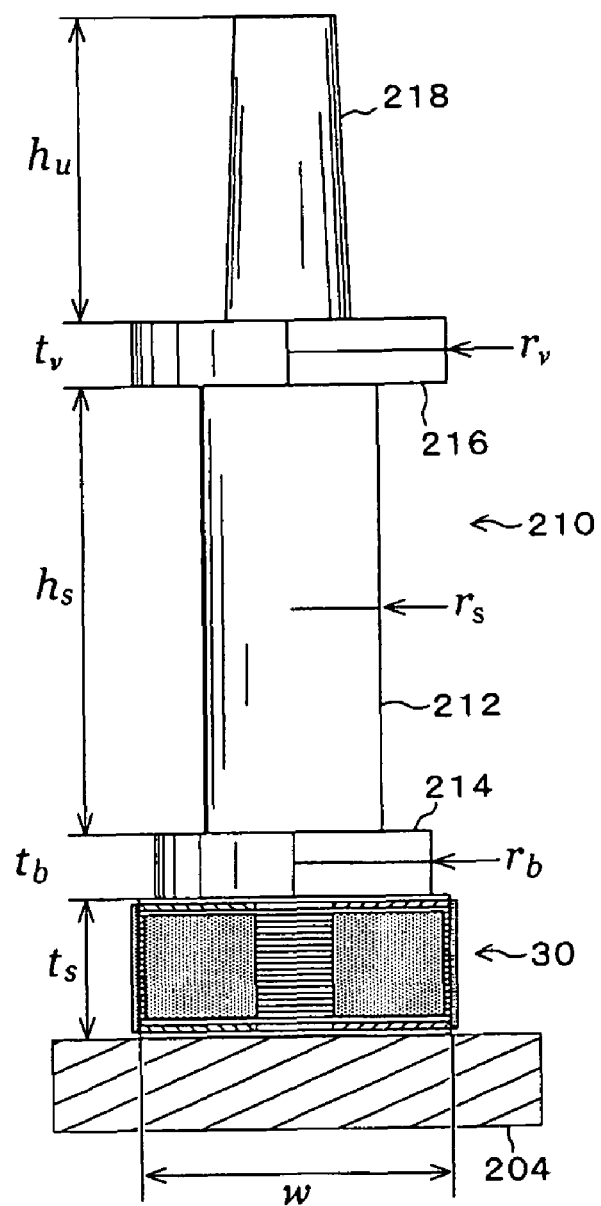

[Fig. 19]
(A)
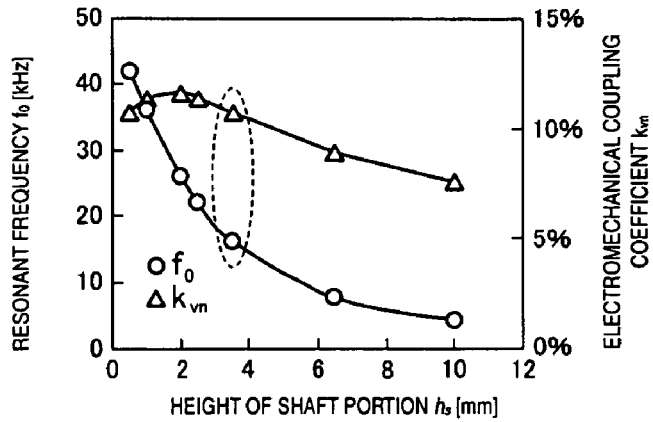
(B)
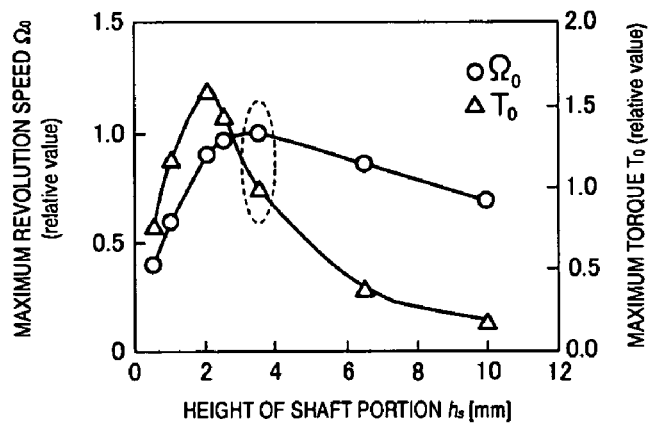
(C)
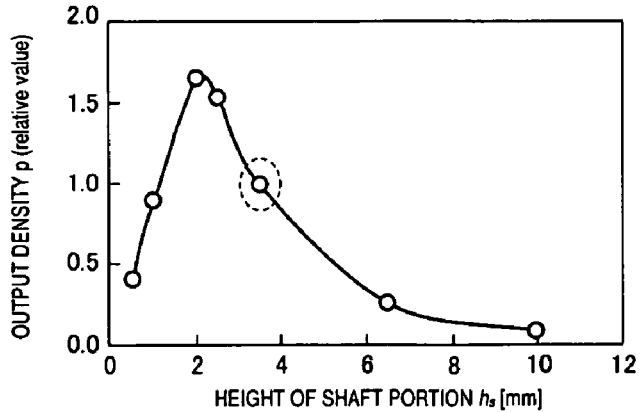

[Fig. 20]
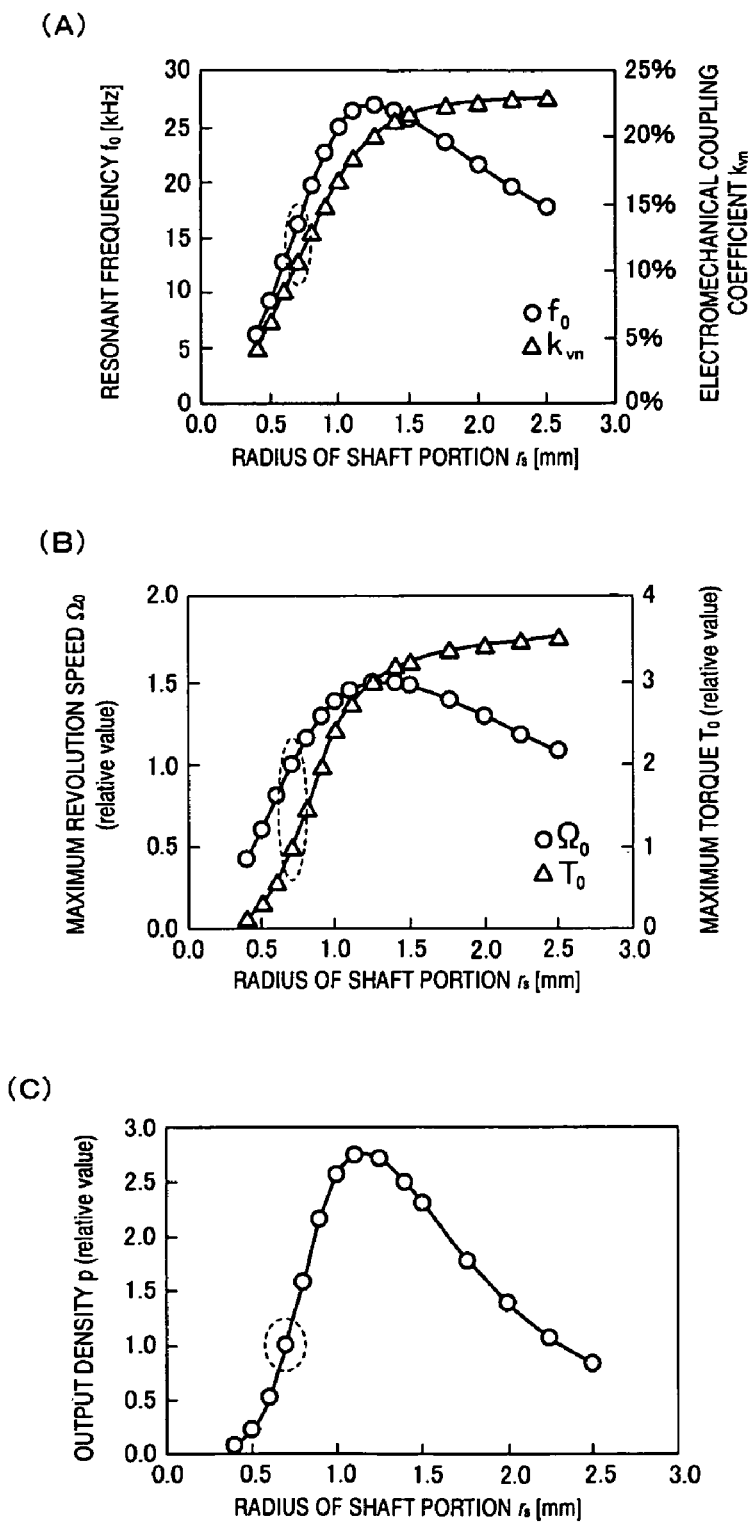

[Fig. 21]
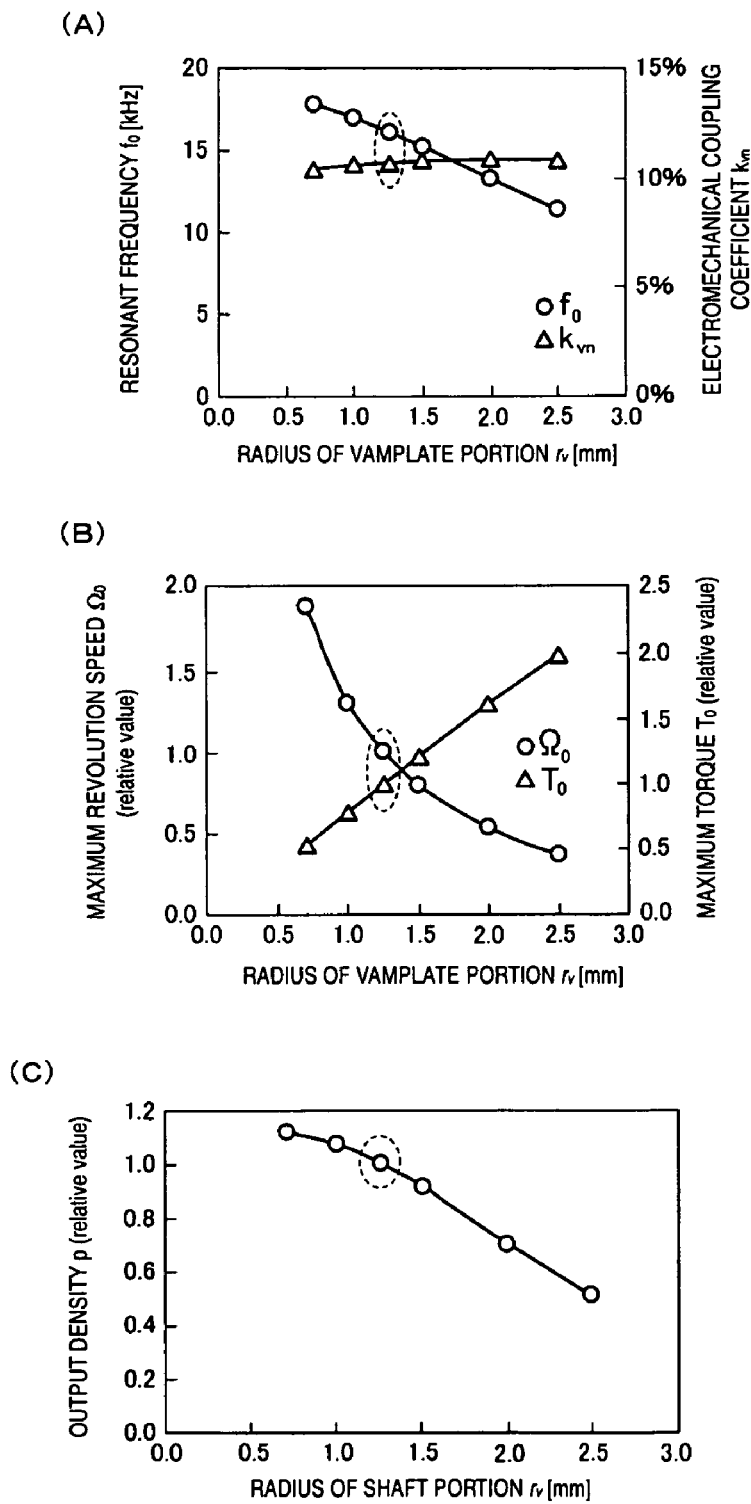

[Fig. 22]
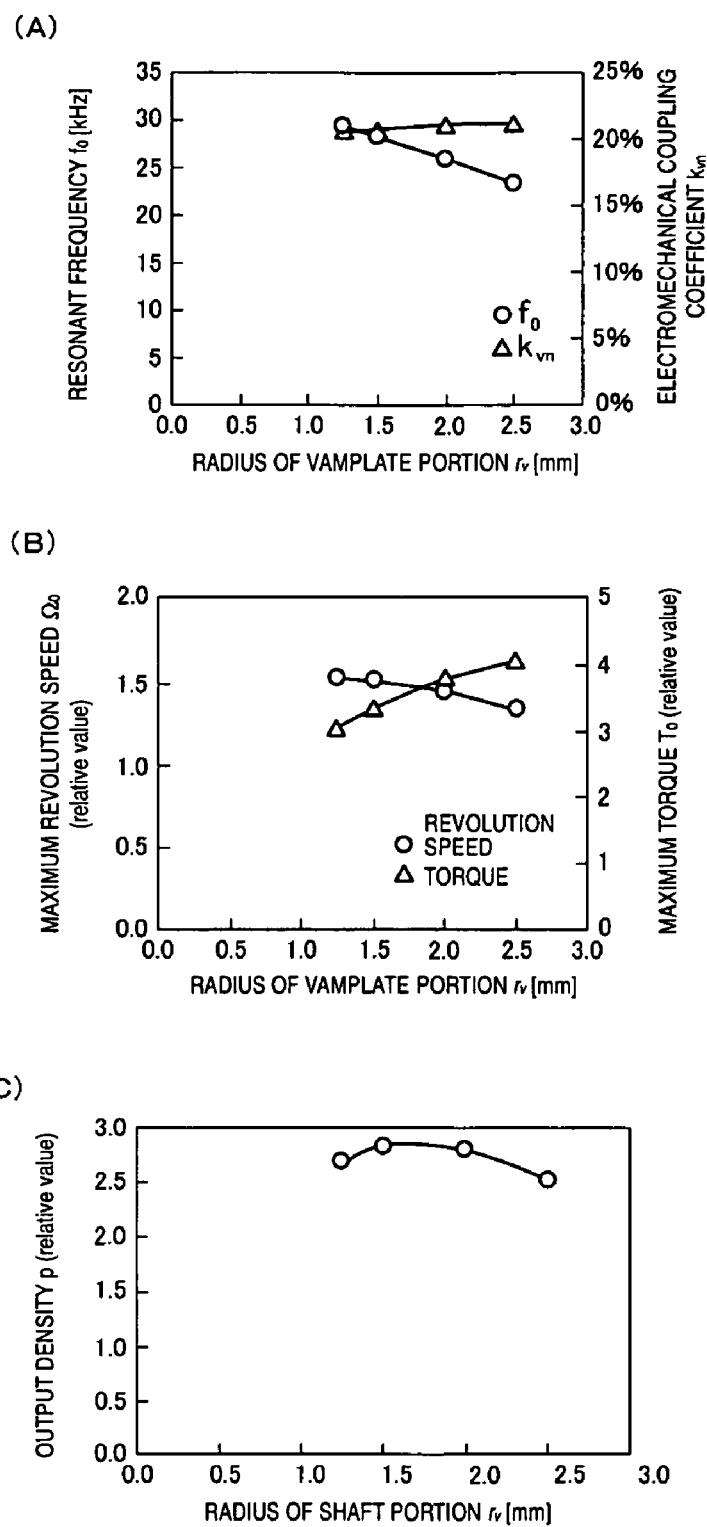

[Fig. 23]
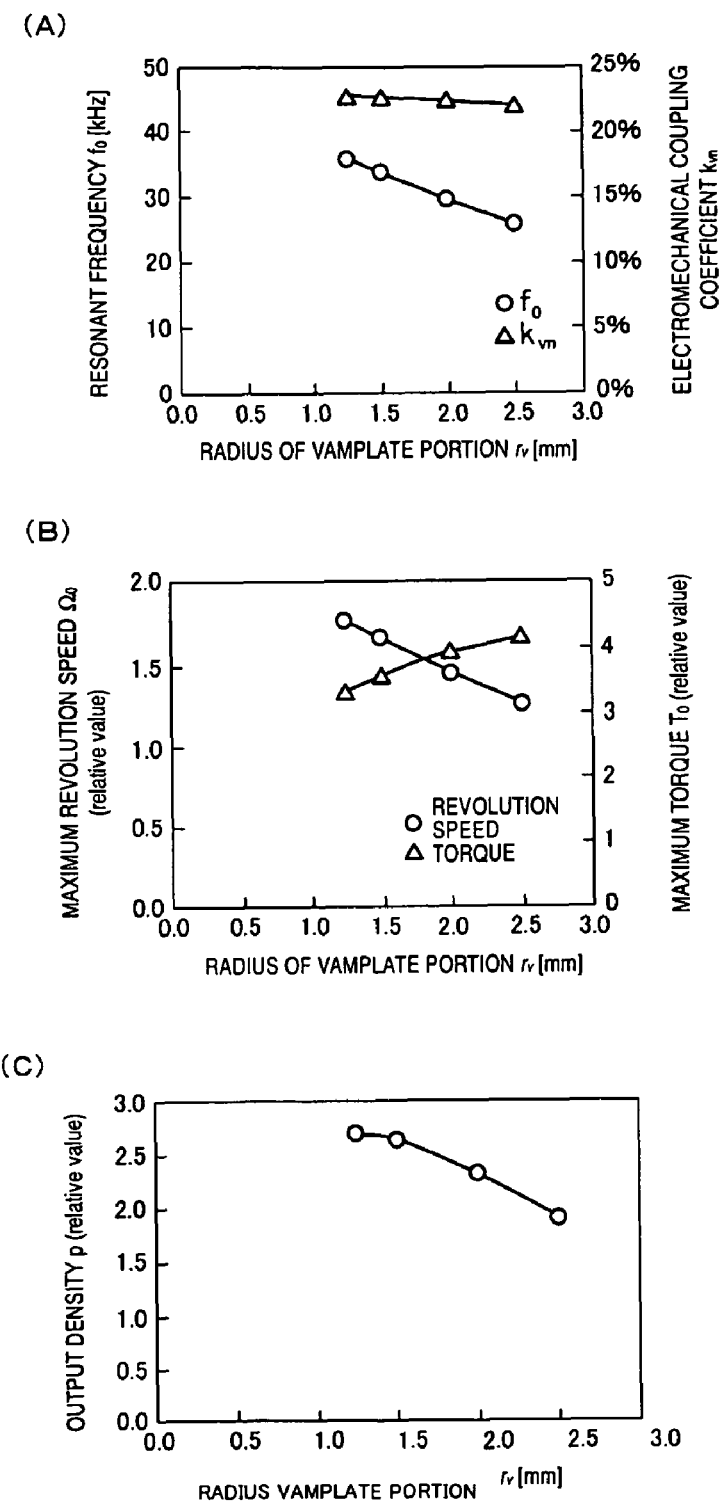

[Fig. 24] Background Art
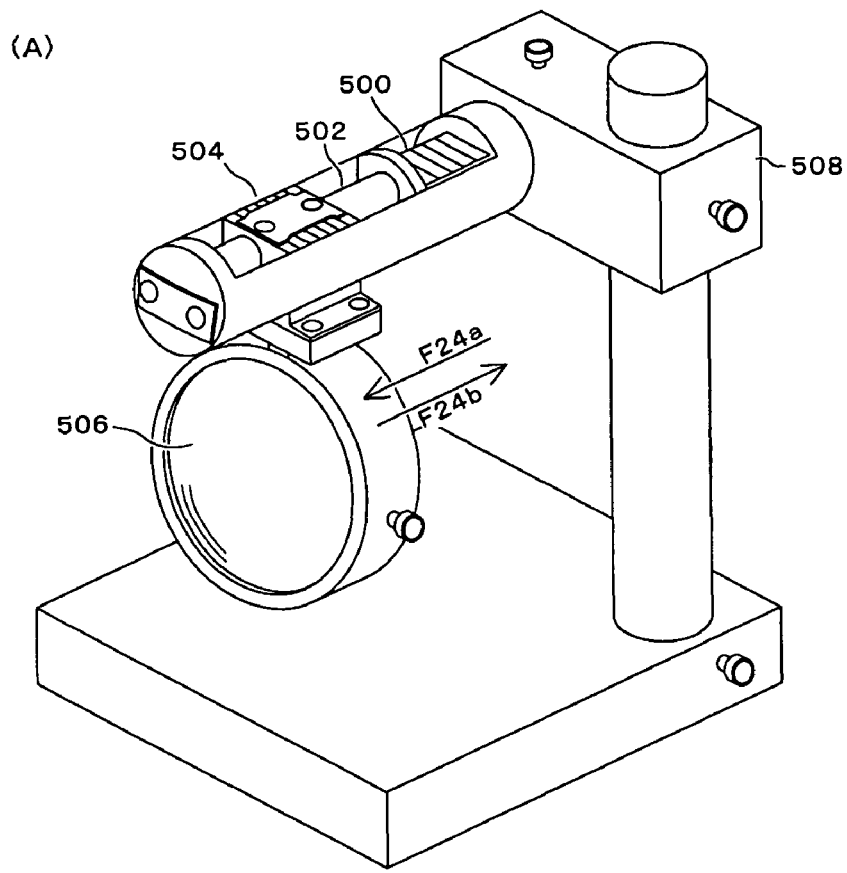
(A)
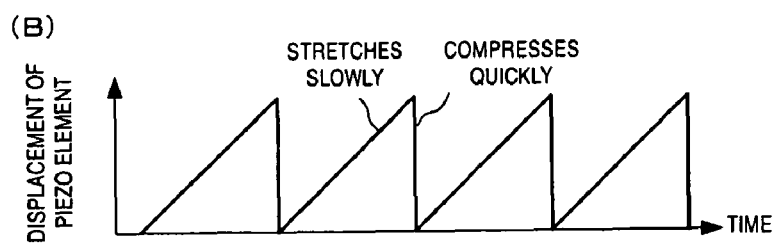
(B)
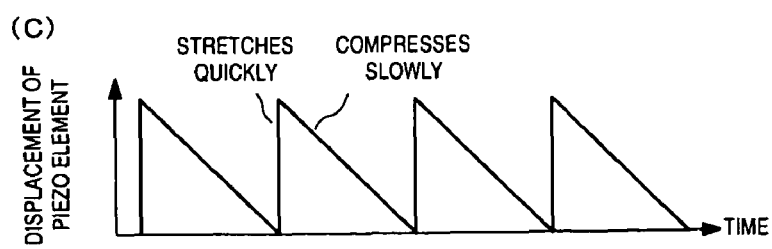
(C)

[Fig. 25] Background Art
(A)
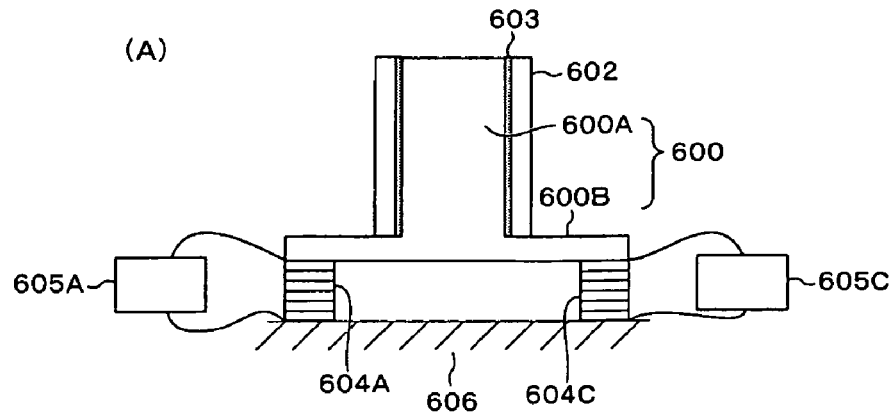
(B)
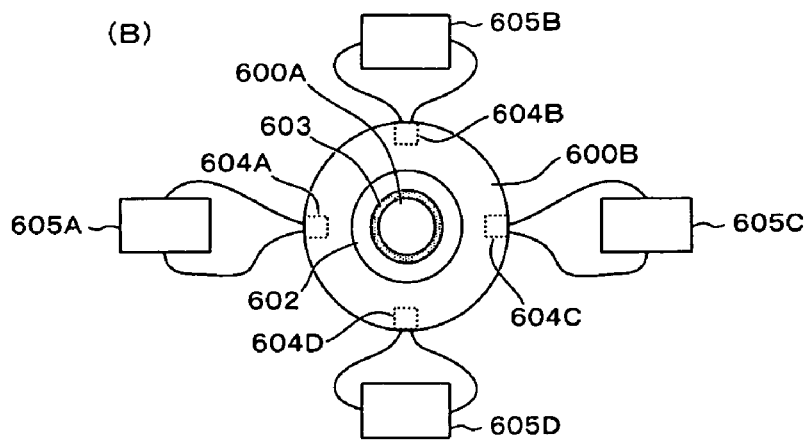
(C)
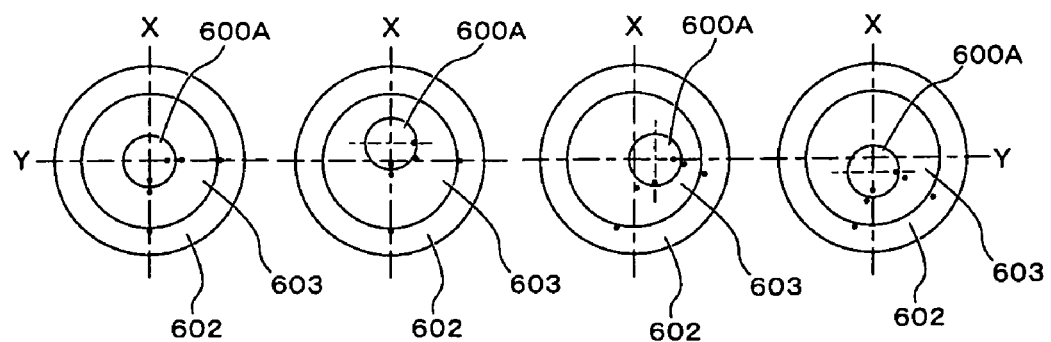

[Fig. 26]
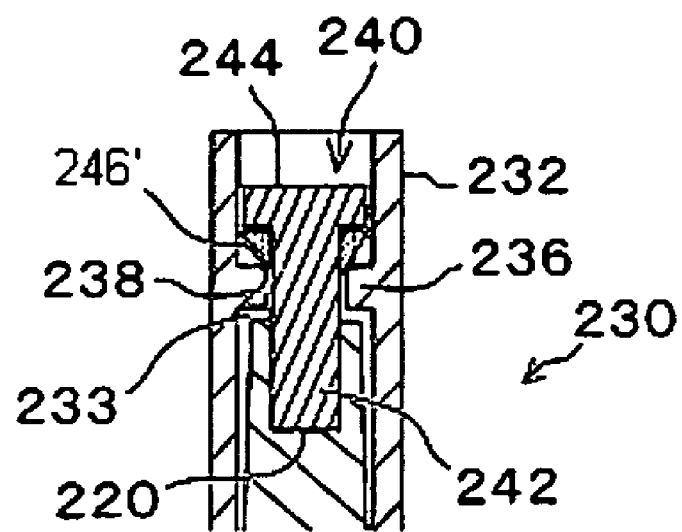
[Fig. 27]
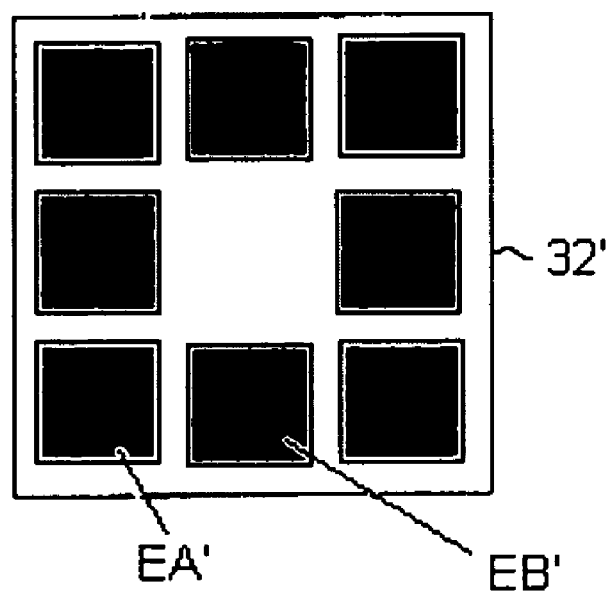

PIEZO DRIVE SYSTEM

BACKGROUND OF THE INVENTION

1. Field of the Invention

The present invention relates to a piezo drive system for driving a body to be driven or displaced, using a piezo drive element and, more particularly, to a piezo drive system for rotationally driving a rotor.

2. Description of the Related Art

In the past, general techniques for driving lenses incorporated in optical devices (such as the taking lens of a camera, a projector lens included in an overhead projector, lenses in binoculars, and lenses in a copier) or in machines including a driven portion such as a plotter or X-Y driving table have used impact actuators as disclosed in the following patent references 1-8. In these techniques, a piezo element is slowly stretched and then quickly compressed. Alternatively, the element is quickly stretched and then slowly compressed. Thus, an inertial force and a frictional force are made to act alternately to produce a linear drive of a lens or lenses. Patent reference 1 sets forth a typical technique of the aforementioned actuator mechanism. The other patent references 2-8 describe how the actuator mechanism is used.

[Patent reference 1] JP-A-4-069070
[Patent reference 2] JP-A-11-18447
[Patent reference 3] JP-A-11-44899
[Patent reference 4] JP-A-11-75382
[Patent reference 5] JP-A-2000-19376
[Patent reference 6] JP-A-2003-141827
[Patent reference 7] JP-A-2003-317410
[Patent reference 8] JP-A-2004-56951

The mechanism of the above-described actuator mechanism is described by referring to FIGS. 24A-24C. FIG. 24A is a schematic perspective view of a piezo drive system. FIGS. 24B and 24C are graphs illustrating the relationship between the displacement magnitude of a piezo element and time. The actuator shown in FIG. 24A includes a piezo element 500, a shaft 502, a slider 504, and a lens 506. One face of the piezo element 500 is connected to the shaft 502, while the other face is secured to the body 508. The shaft 502 extends through the slider 504. The slider 504 is biased against the shaft 502 by a biasing means (not shown) to hold the shaft. The slider 504 is displaced along the shaft 502 via the frictional force acting between the slider 504 and the shaft 502 by the biasing means. When the slider 504 is displaced, the lens 506 mounted to the front end of the slider 504 is displaced in the direction of the arrow F24a or F24b. Motion of the front-end side of the shaft 502 is merely suppressed by a spring. The front-end side of the shaft 502 is not fixed.

If an electric signal that is asymmetric with respect to time as shown in FIG. 24B is applied to the piezo element 500 to drive it in such a way that the device is slowly stretched and then quickly compressed, when the piezo element 500 is slowly stretched, the shaft 502 moves in the direction of the arrow F24a. At this time, the slider 504 is frictionally moved together with the shaft 502. If the piezo element 500 is quickly compressed, the slider 504 is kept at rest by the inertia force. Only the shaft 502 is attracted in the direction of the arrow F24b. Consequently, the slider 504 moves relative to the shaft 502 in the direction of the arrow F24a. By repeating these operations, the slider 504 is linearly driven in the direction of the arrow F24a.

On the other hand, if an electric signal that is asymmetric with respect to time as shown in FIG. 24C is applied to the piezo element 500 to drive it in such a way that it is quickly stretched and then slowly compressed, the slider 504 is linearly driven in the direction of the arrow F24b by the action reverse to the foregoing action. The system of driving the actuator as described so far is simple in structure. Therefore, it is put into practical use as an actuator for auto focus of a digital camera module for use in a cellular phone.

Patent reference 9 described below discloses a drive mechanism making use of four multilayered piezo elements. The technique of this patent reference 9 is described by referring to FIGS. 25A-25C. The drive mechanism has the four multilayered piezo elements 604A-604D on which a circular flat plate 600B of a stator 600 is fixedly mounted. The flat plate 600B has a pillar 600A in its center. The pillar 600A is fitted in an elastic body 603 of a substantially cylindrical rotor 602, the elastic body being made of hard rubber or the like. The multilayered piezo elements 604A-604D are fixed to a base 606. Drive circuits 605A-605D are connected with the multilayered piezo elements 604A-604D, respectively. The pillar 600A of the stator 600 is tilted and made to produce a rotation by applying alternating electric fields across adjacent ones of the multilayered piezo elements 604A-604D, the electric fields being 90° out of phase. The frictional force from the elastic body 603 rotates the rotor 602 along the rotation direction of the pillar 600A.

[Patent reference 9] JP-A-3-74180

Lens modules used in digital cameras for use in cellular phones have been required to achieve high functions such as higher pixel count optical elements, zooming, autofocusing, and anti-jitter stabilization at lower cost. The electromagnetic type needs magnetic coupling and so it is difficult to achieve further miniaturization. The electrostatic type needs higher voltage. In contrast with these types, the aforementioned piezoelectric provides higher energy density if the size is reduced. Therefore, the piezoelectric has attracted attention as a small-sized actuator.

However, in the background art shown in FIGS. 24A-24C, the slider 504 and shaft 502 are in contact with each other via a frictional force and, therefore, they tend to be firmly stuck together. Especially, the direction of displacement of the piezo element 500 is perpendicular to the direction in which the fixing strength acts. Displacement of the piezo element 500 does not directly act on cutting of the fixing strength or on suppression. Accordingly, in order to drive the slider 504, it is necessary to displace the piezo element 500 greatly. Hence, the slider is driven at low efficiency. It is difficult to drive the slider at low voltage.

In the known structure shown in FIGS. 25(A) and 25(B), the rotor 602 and stator 600 are in contact with each other at a location where the end angle of the pillar 600A is displaced maximally. That is, they are in contact with each other at one point. Under this condition, the rotor is driven. Therefore, it is difficult to obtain stable driving force. Furthermore, it is difficult to adjust the rotor 602 in pushing it against the stator 600. In addition, rotation may be suppressed because the bottom of the rotor 602 touches the circular flat plate 600B of the stator 600. Further, the symmetry of rotation vibrations is easily lost because the four multilayered piezo elements are arranged. It is difficult to control vibrations, and the structure is complex. Hence, a large number of steps are required to assemble the structure.

BRIEF SUMMARY OF THE INVENTION

In view of the foregoing, it is an object of at least one embodiment of the present invention to provide a piezo drive system that is small in size, lightweight, exhibits excellent driving properties, and provides high versatility.

The above-described object is achieved in accordance with the teachings of at least one embodiment of the present invention by a piezo drive system having: a piezo drive element having first and second faces located opposite to each other; a rod having one end secured to the first face of the piezo drive element, the rod having a shaft portion extending upward and an outer surface on which a vamplate portion is formed, the shaft portion having a front portion located closer to the front end of the rod than the vamplate portion; a rotor into which the front portion of the shaft portion can be inserted, the rotor making a surface contact with the vamplate portion, the rotor being capable of rotating relative to the rod; and preloading means for pushing the rotor against the vamplate portion of the rod. The piezo drive element causes the rod to produce a torque, thus rotationally driving the rotor.

In one main aspect of the present invention, the rod rotates while being tilted such that the front end of the rod rotates within a plane perpendicular to the center axis of the rod. That is, the front end of the rod revolves about its center.

In another aspect of the invention, the rotor includes a rotor body and a hollow cylindrical portion formed continuously with the rotor body into which the front portion of the shaft portion closer to the front end of the rod than the vamplate portion of the rod can be inserted. The rotor body has a flat surface capable of making a contact with the flat surface of the vamplate portion of the rod. The front portion of the shaft portion located closer to the front end than the vamplate portion of the rod can be inserted into the cylindrical portion.

In a further aspect of the invention, the preloading means has a resilient fixed frame and plural protrusions regularly spaced from each other. The frame has a substantially U-shaped cross section formed by a first surface portion, a second surface portion opposite to the first surface portion, and a side surface portion interconnecting the first and second surface portions. The first surface portion has a top surface on which the second face of the piezo drive element is mounted. The protrusions are mounted under the second face such that the flat surface of the rotor body is pressed against the flat surface of the vamplate portion of the rod by elastic force of the fixed frame.

In a still other aspect of the invention, the second face is divided into a pair of arms by a groove through which the cylindrical portion of the rotor can extend. The arms act to support the opposite sides of the cylindrical portion. The aforementioned protrusions are formed on the arms of one pair.

In a yet other aspect of the invention, there is further provided a preload adjustment frame shaped like the letter L or U. The first and second surface portions of the fixed frame can be sandwiched between opposite portions of the preload adjustment frame that is located outside the first and second surface portions of the fixed frame. The preload adjustment frame touches or engages the second surface portion or the arms of one pair, thus adjusting the manner in which the fixed frame is pushed against the rotor.

In an additional aspect of the invention, the protrusions provide points or lines in contact with the flat surface of the rotor body.

In a still additional aspect of the invention, the front portion of the shaft portion located closer to the front end of the rod than the vamplate portion of the rod is set shorter than the cylindrical portion of the rotor. The preloading means includes a resilient fixed frame and a ball-like body pushing against the rotor. The fixed frame has a substantially U-shaped cross section formed by a first surface portion, a second surface portion opposite to the first surface portion, and a side surface portion interconnecting the first and second surface portions. The first surface portion has a top surface on which the second face of the piezo drive element is mounted. The ball-like body is disposed in the center of the lower side of the second surface portion such that the flat surface portion of the rotor body is pressed against the flat surface of the vamplate portion of the rod by elastic force of the fixed frame. The ball-like body has a surface portion fitted into the front end of the cylindrical portion.

In a further additional aspect of the invention, the second surface portion is so tilted that the angle made between the line normal to the second surface portion of the fixed frame and the axis of the rod is less than 5°.

In a more further aspect of the invention, the second surface portion of the fixed frame is made thinner than any other portion.

In an additional aspect of the invention, the front portion of the shaft portion located closer to the front end of the rod than the vamplate portion of the rod is set shorter than the cylindrical portion of the rotor. The preloading means has a fixing frame to which the second face of the piezo drive element is mounted, a fitting hole formed in the front end of the rod and extending axially, a shaft portion capable of being fitted in the fitting hole, a fast pin having a head portion capable of being received inside the cylindrical portion of the rotor, a catching part protruding from the inner surface of the cylindrical portion of the rotor, and an elastic body pushing against the rotor via the fast pin. The shaft portion of the fast pin can extend through the catching part, which can engage with the head portion of the fast pin. The elastic body is disposed between the catching part and the head portion of the fast pin.

In an additional aspect of the invention, the piezo drive element has plural regions divided about an origin formed by the center of the device. Adjacent ones of the plural regions are different in thicknesswise displacement.

In an additional aspect of the invention, the plural regions are two or four regions shaped symmetrically with respect to the rod.

In an additional aspect of the invention, the piezo drive element has a laminate structure in which piezoelectric substances and internal electrodes are alternately stacked on top of each other. At least some of the internal electrodes are divided into plural portions about the origin formed by the center of the piezo drive element.

In an additional aspect of the invention, the revolution speed or torque can be controlled by adjusting any one of the height of the shaft portion of the rod between each face of the piezo drive element and the vamplate portion, the radius of the shaft portion, and the radius of the vamplate portion.

In an additional aspect of the invention, the radius of the shaft portion is set to a half of the width of each face of the piezo drive element.

The foregoing and other objects, features, and advantages of the present invention will become apparent from the following detailed description and accompanying drawings.

In the present invention, the vamplate portion is formed on the outer surface of the rod whose one end is fixed to one face of the piezo drive element. The pressing force means preloads the rotor that makes a surface contact with the vamplate portion. The single piezo drive element causes the rod to produce a torque. This rotationally drives the rotor. Consequently, there is the advantage that a piezo drive system is obtained which is small and light in weight but which exhibits excellent driving properties and high versatility.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

FIG. 1A is a perspective view of a piezo drive system of Embodiment 1 of the present invention, showing the outer appearance of the unit;

FIG. 1B is a side elevation as viewed from the direction of arrow F1 of FIG. 1A;

FIG. 1C is a side elevation of a piezo drive system according to a modification of the Embodiment 1;

FIG. 2 is an exploded perspective view of the piezo drive system of the Embodiment 1;

FIG. 3A is a perspective view of the drive element and rod of the Embodiment 1;

FIG. 3B is a plan view as viewed from the direction of arrow F3 of FIG. 3A;

FIG. 4A is an exploded perspective view of the laminate structure of the drive element of the Embodiment 1;

FIG. 4B is a cross-sectional view taken along line #4-#4 of FIG. 4A and as viewed from the direction of the arrow;

FIG. 4C is a schematic diagram showing the displacement distribution in the direction of thickness;

FIGS. 5A-1 and 5A-2 are perspective views of the drive element of the Embodiment 1, showing extension portions of internal electrodes;

FIGS. 5B-1 and 5B-2 are perspective views of the drive element of the Embodiment 1, showing the arrangement of outer electrodes;

FIGS. 6A and 6B are graphs showing the relation between revolution speed and torque for various values of driving voltage in the Embodiment 1;

FIG. 7A is a perspective view of a piezo drive system according to Embodiment 2 of the invention;

FIG. 7B is a side elevation as viewed in the direction of arrow F7 of FIG. 7A;

FIG. 7C is a side elevation of a piezo drive system according to a modification of the Embodiment 2;

FIGS. 8A and 8B are side elevations of piezo drive systems according to another modification of the Embodiment 2;

FIG. 9A is a side elevation of a driver unit according to Embodiment 3 of the invention;

FIG. 9B is a cross-sectional view taken on line #9-#9 of FIG. 9A and as viewed in the direction of the arrow;

FIG. 10A is a side elevation of a piezo drive system according to a modification of the Embodiment 3;

FIG. 10B is a cross-sectional view taken on line #10-#10 of FIG. 10A and as viewed in the direction of the arrow;

FIG. 11A is a side elevation of a piezo drive system according to another modification of the Embodiment 3;

FIG. 11B is a cross-sectional view taken on line #11-#11 of FIG. 11A and as viewed in the direction of the arrow;

FIG. 12A is a side elevation of a piezo drive system according to a further modification of the Embodiment 3;

FIG. 12B is a cross-sectional view taken on line #12-#12 of FIG. 12A and as viewed in the direction of the arrow;

FIG. 13A is a side elevation of a piezo drive system according to an additional modification of the Embodiment 3;

FIG. 13B is a cross-sectional view taken on line #13-#13 of FIG. 13A and as viewed in the direction of the arrow;

FIG. 14A is a side elevation of a piezo drive system according to Embodiment 4 of the invention;

FIG. 14B is a side elevation of a piezo drive system according to a modification of the Embodiment 4;

FIG. 15A is a side elevation of a piezo drive system according to another modification of the Embodiment 4;

FIG. 15B is a side elevation of a piezo drive system according to a further modification of the Embodiment 4;

FIG. 16A is a perspective view of a piezo drive system according to Embodiment 5 of the invention, showing the outer appearance of the unit;

FIG. 16B is a side elevation as viewed from the direction of arrow F16 of FIG. 16A;

FIG. 16C is a plan view of the upper surface of the fixed frame of the piezo drive system shown in FIG. 16A;

FIG. 16D-1 is a perspective view of a piezo drive system according to a modification of the Embodiment 5;

FIG. 16D-2 is a top plan view of the piezo drive system shown in FIG. 16D-1;

FIG. 17A is a perspective view of a piezo drive system according to a modification of the Embodiment 5, showing the outer appearance of the unit;

FIG. 17B is a side elevation as viewed from the direction of arrow F17 of FIG. 17A;

FIG. 18 is a front elevation of a stator vibrator included in a piezo drive system according to Embodiment 6 of the invention, showing the structure of the vibrator;

FIGS. 19A-19C are graphs showing the relations of the stator vibrators and motor properties of Embodiment 6 to the height of the shaft portion of the rod;

FIGS. 20A-20C are graphs showing the relations of the stator vibrators and motor properties of the Embodiment 6 to the radius of the shaft portion of the rod;

FIGS. 21A-21C are graphs showing the relations of the stator vibrators and motor properties of the Embodiment 6 to the radius of the vamplate portion of the rod;

FIGS. 22A-22C are graphs showing the relations of the stator vibrators and motor properties of the Embodiment 6 to the radius of the vamplate portion of the rod;

FIGS. 23A-23C are graphs showing the relations of the stator vibrators and motor properties of the Embodiment 6 to the radius of the vamplate portion of the rod;

FIG. 24A is a perspective view of conventional piezo drive system;

FIGS. 24A and 24B are graphs showing characteristics of the conventional piezo drive system shown in FIG. 24A;

FIG. 25A is a side elevation of another conventional piezo drive system;

FIG. 25B is atop plan view of the conventional piezo drive system shown in FIG. 25A; and FIG. 25C shows the manner in which a pillar 600A rotates.

FIG. 26 is a partial cross sectional view of an upper structure corresponding to FIG. 9B according to another embodiment of the present invention.

FIG. 27 is a plane view of a layered product according to another embodiment of the present invention.

DETAILED DESCRIPTION OF THE INVENTION

The best mode for carrying out the present invention is hereinafter described in detail with reference to its preferred embodiments. However, the preferred embodiments are not intended to limit the present invention.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in specific embodiments can be modified by a range of at least ±50% in other embodiments, and the ranges applied in embodiments may include or exclude the endpoints.

Embodiment 1

First, Embodiment 1 of the present invention is described by referring to FIGS. 1A-6B. The present embodiment gives an example of application of a piezo drive system according to the present invention to an ultrasonic motor. FIG. 1A is a perspective view of the motor, showing its outer appearance. FIG. 1B is a side elevation as viewed from the direction of arrow F1 of FIG. 1A. FIG. 1C is a side elevation of an ultrasonic motor according to a modification of the Embodiment 1. FIG. 2 is an exploded perspective view of the ultrasonic motor shown in FIG. 1A. FIG. 3A is a perspective view of a drive element and a rod included in the ultrasonic motor according to the present embodiment. FIG. 3B is a plan view as viewed from the direction of the arrow F3 of FIG. 3A. FIG. 4A is an exploded perspective view of the laminate structure of a drive element according to the present embodiment. FIG. 4B is a cross-sectional view taken on line #4-#4 of FIG. 4A and as viewed in the direction of the arrow. FIG. 4C is a schematic diagram showing the distributions of displacements in the direction of thickness. FIGS. 5A-1 and 5A-2 are perspective views of extraction parts of internal electrodes of the drive element shown in FIG. 4A. FIGS. 5B-1 and 5B-2 are perspective views showing the arrangement of external electrodes of the drive element shown in FIG. 4A. FIG. 6A shows the relation of revolution speed to driving voltage, as well as the relation of torque to the driving voltage regarding the present embodiment. FIG. 6B shows the relation of torque to revolution speed regarding the present embodiment.

As shown in FIGS. 1A-3B, the piezo drive system of the present embodiment is generally indicated by reference numeral 10 and made up of a fixed frame 12, a piezo drive element 30, a rod 40, and a rotor 50. A subassembly including the drive element 30 to a first face 801 of which the rod 40 is mounted may be referred to as a stator vibrator. The fixed frame 12 holds the structure of the piezo drive system 10. In addition, the frame 12 acts also as a preloading means acting to press the rotor 50 against the stator vibrator.

The fixed frame 12 is shaped like the letter U formed by a bottom surface portion 14 to which a second face 802 of the drive element 30 is fixedly mounted, a top surface portion 16, and a side surface portion 18. The top surface portion 16 is provided with an opening 20 through which a cylindrical portion 52 of the rotor 50 can extend. The frame 12 is made of a resilient material. In the present embodiment, the bottom surface portion 14, top surface portion 16, and side surface portion 18 are substantially identical in thickness. Plural protrusions 22 are formed on the inside of the top surface portion 16 and can make contact with a flat surface portion of a disk portion 56 of the rotor 50. In the illustrated example, the number of the protrusions 22 is three. The protrusions 22 are made to push against the flat surface portion of the disk portion 56 by the elastic force of the fixed frame 12. This constitutes a preloading means that preloads the disk portion, i.e., before the piezo drive element is operated, to permit the rotor 50 to rotate. Accordingly, the fixed frame 12 is made of stainless steel, for example. The bottom surface portion 14, top surface portion 16, and side surface portion 18 may be formed integrally or separately.

The drive element 30 is an array of four displacement elements. One end of the rod 40 is fixed to one face of the drive element 30. The other face is fixed to the upper surface of the bottom surface portion 14 of the fixed frame 12. The drive element 30 is bonded to the fixed frame 12 with an epoxy type adhesive or the like. Similarly, the rod 40 is bonded to the drive element 30 with an epoxy type adhesive. Alternating electric fields with opposite phases are applied across the diagonally disposed displacement elements. Alternating electric fields which are 90° out of phase are applied across the adjacent displacement elements. Consequently, a double flexural mode of a cantilever is produced (numeral 800 shows first longitudinal vibration). The drive element 30 is of laminate structure having intervening electrodes to obtain submicron displacements even in a non-resonant state.

The structure of the drive element 30 is now described in detail by referring to FIGS. 4A through 5B-2. In the drive element 30, plural piezoelectric bodies 70A-70L and plural internal electrodes EA1, EA2, EB1, EB2, and EG are stacked on top of each other. The piezoelectric substance 70A is placed in the top layer. The divisionally formed, internal electrodes EA1, EA2, EB1, and EB2 are formed between the piezoelectric substance 70A and the piezoelectric substance 70B in the bottom layer. Of these internal electrodes, the internal electrodes EA1 and EA2 are shaped with a point symmetry with respect to the center of the element. Similarly, the internal electrodes EB1 and EB2 are shaped with a point symmetry with respect to the center of the element. That is, the electrodes EA1, EB1, EA2, EB2, EA1 and so on are arranged in this order and disposed around the center of the element. The internal electrodes EA1 and EB2 have extraction parts 72 and 78 extending in the −Y-direction. The electrodes EB1 and EA2 have extraction parts 76 and 74 extending in the Y-direction. The longitudinal direction of the extraction parts 72-78 applies to the case where the drive element 30 is placed in the sense shown in FIGS. 4A to 5B-2.

The internal electrode EG acting as a counter electrode is mounted between the piezoelectric substances 70B and 70C. The internal electrode EG is divided into four parts that correspond in position with the internal electrodes EA1, EA2, EB1, and EB2, respectively. The four parts have electrode extraction parts 80, respectively. The extraction part 80 of the internal electrode EG overlapping with the internal electrodes EA1 and EB1 extends in the −X-direction. The extraction part 80 of the internal electrode EG overlapping with the internal electrodes EB2 and EA2 extends in the X-direction. The internal electrodes sandwiched between the subsequent piezoelectric substances 70C to 70L are repeating structures of (EA1, EA2, EB1, EB2), EG, (EA1, EA2, EB1, EB2), EG, etc. Thus, a layered product 32 is obtained.

As shown in FIGS. 5A-1, 5A-2, 5B-1, and 5B-2, the extension portions 80 of the internal electrodes EG are arrayed on the opposite side surfaces of one pair of the layered product 32. External electrodes 38 are connected with the extension portions. In the case of the present embodiment, four external electrodes 38 are connected. The extension portions 72 of the internal electrode EA1 and extension portions 78 of the internal electrode EB2 are juxtapositionally brought out from other side surfaces of the layered product 32. External electrodes 34 and 37 are connected with the extension portions 72 and 78, respectively. Extension portions 74 of the internal electrode EA2 and extension portions 76 of the internal electrode EB1 are juxtapositionally brought out from the further other side surfaces of the layered product 32. External electrodes 35 and 36 are connected with the extension portions 74 and 76, respectively. The piezoelectric substances 70A-70L are made of a material consisting chiefly of Pb(Zr, Ti)O$_3$, for example. The internal electrodes EA1, EA2, EB1, EB2, EG and the external electrodes 34, 35, 36, 37, 38 are made of Ag—Pd or other material, for example.

A bottom plate 44 that is larger in diameter than the shaft portion 42 is bonded with adhesive to around the center of one face of the drive element 30 as shown in FIG. 3A. The bottom plate 44 is located at one end side of the shaft portion 42 of the rod 40. As shown in FIG. 3B, a driving power supply 60 forming an input A is connected between the external electrodes 34 and 38 of the drive element 30. A driving power supply 62 forming an input −A is connected between the external electrodes 35 and 38. A driving power supply 64 forming an input B is connected between the external electrodes 36 and 38. A driving power supply 66 forming an input −B is connected between the external electrodes 37 and 38. Signals having phases different from the phase of the signal applied to the internal electrode EG are applied to the internal electrodes EA1, EA2 and to the electrodes EB1, EB2. As a result, four regions that are different in displacement in the direction of the thickness of the element are formed about the center, or the origin, of the drive element 30. In this example, the internal electrodes EA1, EA2, EB1, and EB2 are all polarized in the same direction. Adjacent distributions are 90° out of positional phase and, therefore, if signals that are 90° out of time phase are applied to the internal electrodes EA1, EA2 and internal electrodes EB1, EB2, then the four split portions inside the single drive element 30 are displaced about the axis of the rod 40, thus producing traveling waves. That is, as shown in FIG. 4C, the drive element 30 has four regions P, Q, R, and S that are different in amount of thicknesswise displacement (in the figure, the differences in displacement and positional phase between P, Q, R, and S are imaginarily shown using small squares and different tones). Consequently, as indicated by the arrow Fa in FIGS. 1A and 3A, the rod 40 excited in a double flexural mode of a cantilever is rotated while tilting.

The rod 40 is next described. The rod 40 has the bottom plate 44 at one end of the shaft portion 42. Furthermore, the rod 40 has a vamplate portion 46 at an appropriate position on the outer surface of the shaft portion 42, the vamplate portion 46 extending substantially perpendicularly to the axial direction. The rod 40 has a front portion 48 located above the vamplate portion 46, the front portion being closer to the front end 803 of the rod than the vamplate portion. The front portion is smaller in diameter than the portion between the bottom plate 44 and the vamplate portion 46. The front portion 48 tapers off toward the end and can be inserted into the rotor 50 (described later). The bottom plate 44 excites bending vibrations by vertical vibrations of the drive element 30, and is shaped like a disk. The bottom plate 44 is bonded to one face of the drive element 30 with adhesive. The rod 40 is made of bronze or other metal.

The rotor 50 is substantially centrally provided with an opening (not shown) through which the front portion 48 of the rod 40 extends. The rotor 50 has the disk portion 56 and the substantially cylindrical portion 52 continuous with the disk portion 56 that makes a surface contact with the vamplate portion 46 of the rod 40. The cylindrical portion 52 has a hollow portion into which the front portion 48 can be inserted. In the illustrated example, the front portion 48 of the rod 40 is fully received in the hollow portion 54 of the cylindrical portion 52. The rotor 50 frictionally receives the driving force at the disk portion 56 and is rotated. Output can be taken from the cylindrical portion 52. That is, the cylindrical portion acts as the shaft of the ultrasonic motor. The rotor 50 is made of stainless steel, for example.

The operation of the present embodiment is next described. First, one face of the drive element 30 is fastened to the upper surface of the bottom surface portion 14 of the fixed frame 12. The bottom plate 44 of the rod 40 is fastened to the other face. The rotor 50 is mounted to the rod 40. Subsequently, the cylindrical portion 52 of the rotor 50 is inserted into the opening 20 in the top surface portion 16 of the fixed frame 12. The flat surface portion of the disk portion 56 of the rotor 50 is pushed by the elastic force of the frame 12 via the 3, for example, protrusions 22 regularly spaced from each other. The flat surface portion of the disk is preloaded, i.e., before the drive element 30 is driven. The preloading means brings the upper surface of the vamplate portion of the rod 40 into a surface contact with the flat lower surface of the disk portion 56 of the rotor 50. If a rotating force is applied to rotate the front portion 48 of the rotor 50 about the axis, then the rotating force is applied to the flat lower surface of the disk portion 56 of the pushed rotor 50. As a result, the rotor 50 rotates.

When alternating electric fields are applied to the drive element 30 such that the diagonally spaced displacement elements are 180° out of phase and that the adjacent displacement elements are 90° out of phase as shown in Table 1 presented below, a double flexural mode of a cantilever is induced. Then, friction due to the surface contact between the vamplate portion 46 of the rod 40 and the disk portion 56 of the rotor 50 rotates the rotor 50. At this time, the direction of rotation of the rotor 50 (i.e., the direction of arrow Fb in FIG. 1A) is opposite to the direction of rotation of the rod 40 (the direction of arrow Fa). That is, when the rod 40 rotates counterclockwise (CCW), the rotor 50 rotates clockwise (CW). When the rod 40 rotates clockwise, the rotor 50 rotates counterclockwise. Where the phase difference is 90°, the rotor 50 rotates clockwise (CW). Where the phase difference is −90°, the disk 90 rotates counterclockwise (CCW). Because the rotor 50 rotates in this way, a driving force can be taken from the cylindrical portion 52 in the same way as the prior-art electromagnetic motor.

TABLE 1

| INPUT | CCW | CW |
|---|---|---|
| A | E sin ωt | E cos ωt |
| B | E cos ωt | E sin ωt |
| −A | −E sin ωt | −E cos ωt |
| −B | −E cos ωt | −E sin ωt |

Measurements were made while varying the drive voltage. In this case, the relation between the revolution speed of the motor and the torque is shown in FIGS. 6A and 6B. In FIG. 6A, the driving voltage [$V_{p-p}$] is plotted on the horizontal axis. The revolution speed [rpm] of the motor is plotted on the left side of the vertical axis. The torque [gf·cm] is plotted on the right side of the vertical axis. In FIG. 6B, the revolution speed [rmp] is plotted on the horizontal axis, while the torque [gf·cm] is plotted on the vertical axis. The results show that the motor of the present embodiment was started to be driven at a low voltage of 0.2 $V_{p-p}$. A maximum revolution speed of 3,500 rmp and a maximum torque of 0.4 gf·cm were achieved at 3 $V_{p-p}$. In this way, excellent driving properties were obtained. With respect to the contour of the stator vibrator having the drive element 30 to which the rod 40 has been adhesively bonded, the diameter was 3 mm and the length was 8 mm. It has been confirmed that a small-sized piezo drive system having excellent driving properties is obtained.

In this way, according to the Embodiment 1, a rotating force is produced at the front portion 48 of the rod 40 whose one end is fixed to the main face of the drive element 30 to rotate the rod by incorporating the four elements in the single drive element 30. The lower flat surface of the disk portion 56 of the rotor 50 making a surface contact with the upper flat surface of the vamplate portion 46 of the rod 40 is preloaded by the elastic force of the fixed frame 12 via the protrusions 22. Vertical vibrations which generally produce the greatest force by the inverse piezoelectric effect are displaced into bending vibrations and amplified by the aforementioned cantilever structure. Hence, a small-sized motor can be accomplished which is simple in structure, produces retaining force by static friction between the rotor 50 and the vamplate portion 46 even when the motor is not driven, generates high revolution speed, and produces large torque. Accordingly, according to the present embodiment, the piezo drive system 10 can be obtained which exhibits excellent driving properties and provides high versatility though the piezo drive system is small in size and lightweight.

In the above example, the bottom surface portion 14, top surface portion 16, and side surface portion 18 which are used to constitute the fixed frame 12 are substantially identical in thickness. As in the example shown in FIG. 1C, a fixed frame 12A in which a top surface portion 16A is thinner than bottom surface portion 14A and side surface portion 18A may also be used. By using the fixed frame 12A where the bottom surface portion 14A and side surface portion 18A are thicker than the top surface portion 16A in this way, the bottom surface portion of the element forming the pivot of the cantilever can be more firmly secured. As a result, the rod 40 is displaced more greatly. In consequence, deterioration of the properties can be suppressed or the properties can be improved.

Embodiment 2

Embodiment 2 of the present invention is next described by referring to FIGS. 7A-8B. In Embodiments 1, 2, and other Embodiments, like components are indicated by like reference numerals. FIG. 7A is a perspective view of a piezo drive system of the present embodiment. FIG. 7B is a side elevation as viewed from the direction of arrow F7 of FIG. 7A. FIG. 7C is a side elevation of a piezo drive system according to a modification of the Embodiment 2. FIGS. 8A and 8B are side elevations of piezo drive systems according to modifications of the Embodiment 2. In the configuration of the above-described Embodiment 1, the rotor is preloaded by the protrusions formed on the inner surface of the substantially U-shaped fixed frame. In the present Embodiment 2, the rotor is preloaded by making use of the fixed frame and a ball-like body.

The structure shown in FIGS. 7A and 7B is first described. A piezo drive system 100 is made up of fixed frame 102, drive element 30, rod 40, rotor 110, and ball 118. The fixed frame 102 includes a bottom surface portion 104, a top surface portion 106, and a side surface portion 108 resiliently interconnecting the bottom surface portion 104 and top surface portion 106, and is shaped like the letter U. The piezo drive system 100 is made of an elastic material in the same way as in the Embodiment 1. In the rotor 110, a pinion gear 114 and a substantially cylindrical portion 112 are continuous with each other. The front portion 48 of the rod 40 extends through the pinion gear 114, which makes a surface contact with the vamplate portion 46 of the rod 40. The cylindrical portion 112 has a hollow portion 113 into which the front portion 48 can be inserted. In the illustrated example, a given space is formed between the front portion 48 of the rod 40 and the upper end 116 into which the cylindrical portion 112 of the rotor 110 opens.

The ball 118 is disposed between the inside of the top surface portion 106 of the fixed frame 102 and the upper end 116 of the cylindrical portion 112 of the rotor 110. A part of the surface of the ball can be fitted into the opening in the upper end 116. The ball 118 is made, for example, of aluminum or ceramic such as zirconia because they are excellent in wear resistance. The material is not limited to these substances. Metals can also be used. The drive element 30 and rod 40 are similar in configuration with those of the Embodiment 1.

The operation of the present embodiment is next described. First, one face of the drive element 30 is mounted to the inside of the bottom surface portion 104 of the fixed frame 102. The bottom plate 44 of the rod 40 is adhesively bonded to the other face. The rotor 110 is mounted to the rod 40. Subsequently, the ball 118 is held between the upper end 116 of the cylindrical portion 112 of the rotor 110 and the top surface portion 106 of the fixed frame. A part of the surface of the ball 118 is fitted into the upper end 116 of the cylindrical portion 112. The rotor 110 is pushed by the elastic force of the frame 102 via the ball 118, thus preloading the rotor. Alternating electric fields similar to the alternating electric fields used in the Embodiment 1 are applied to the drive element 30. Frictional force produced by surface contact of the vamplate portion 46 of the rod 40 with the bottom surface portion 115 of the pinion gear 114 of the rotor 110 rotates the rotor 110. A driving force can be outputted from the pinion gear 114 to a direction perpendicular to the axis of vibrations. According to the present embodiment, torque can be taken out while lowering the revolution speed. Hence, a small-sized piezo drive system that has high versatility and can operate at high efficiency can be obtained.

Modifications of the present embodiment are next described. A modification is shown in FIG. 7C, where a piezo drive system 100A equipped with a rotor 110A has a cylindrical portion 112A and a pinion gear 114A. The length of the pinion gear 114A is so set that it covers most of the rod 40. A hollow portion 113A into which the front portion 48 of the rod 40 can be inserted and another hollow portion 117 are formed continuously inside the rotor 110A. The hollow portion 117 is larger in diameter than the hollow portion 113A and can receive the vamplate portion 46 of the rod 40. The rotor 110A is rotated by friction produced by surface contact of the boundary surface 115A between the hollow portions 113A and 117 with the vamplate portion 46. A driving force can be outputted to a direction perpendicular to the axis of vibrations from the pinion gear 114A.

Another modification is shown in FIG. 8A, where a piezo drive system 120 includes a rotor 122 having a cylindrical portion 124 and a worm gear 126. A torque is outputted by surface contact of the bottom surface portion 127 of the worm gear 126 with the vamplate portion 46, in the same way as in the example shown in FIGS. 7A and 7B. In the present modification, when the rotor 122 rotates, a driving force can be taken out along the direction of the axis of vibrations (i.e., the rod 40).

A further modification is shown in FIG. 8B, where a piezo drive system 120A includes a rotor 122A made up of a cylindrical portion 124A and a worm gear 126A providing a cover over most of the rod 40. A driving force along the direction of the axis of vibrations can be outputted because of an internal geometry similar to that of the example shown in FIG. 7C and also because of surface contact with the vamplate portion 46 of the rod 40.

Embodiment 3

Embodiment 3 of the present invention is next described by referring to FIGS. 9A-13B. FIG. 9A is a side elevation of a piezoelectric driver unit according to the present embodiment. FIG. 9B is a vertical cross section taken on line #9-#9 of FIG. 9A and as viewed in the direction of the arrow. The piezo drive system, 200, of the present embodiment includes a fixed frame 202, a drive element 30, a rod 210, a rotor 230, and a fast pin 240. The fixed frame 202 is shaped like the letter L by a bottom surface portion 204 and a side surface portion 206. One face of the drive element 30 is secured to the bottom surface portion 204. In the present embodiment, the fixed frame 202 only holds the structure of the piezo drive system 200. There is provided a separate preloading means.

The rod 210 has a bottom plate 214 at one end of a shaft portion 212. A vamplate portion 216 making a surface contact with the rotor 230 is mounted at an appropriate position on the shaft portion 212. The rod 210 has a front portion 218 above the vamplate portion 216, the front portion being closer to the front end of the rod. The front portion 218 is provided with a fitting hole 220 into which the fast pin 240 is fitted. The radius of the front portion 218 is set smaller than that of the portion between the bottom plate 214 and the vamplate portion 216 and can be received in the rotor 230.

In the rotor 230, a substantially cylindrical portion 232 and a disk portion 234 are formed continuously. The disk portion 234 makes a surface contact with the vamplate portion 216 of the rod 210. The front portion 218 of the rod 210 can be inserted into the hollow portion 233 of the cylindrical portion 232. The cylindrical portion 232 is set longer than the front portion 218 such that the front portion 218 is totally received. A flange-shaped catching part 236 protrudes inwardly from the inner surface of the cylindrical portion 232. The catching part 236 is located at a position where it is not touched when the front portion 218 is fully received. The catching part 236 is provided with an opening 238 through which the shaft portion 242 of the fast pin 240 can extend.

The fast pin 240 has a head portion 244, as well as the shaft portion 242. The shaft portion 242 extends through the opening 238 in the rotor 230 and can fit into the engagement hole 220 in the rod 210. The head portion 244 can engage with the catching part 236 via an elastic body 246. Elastic force of the elastic body 246 preloads the rotor 230. The elastic body is made of an engineering plastic or Teflon, for example. Any restriction is imposed neither on the cross-sectional shape of the shaft portion 242 of the fast pin 240 nor on the cross-sectional shape of the engagement hole 220 in the rod 210. The fast pin 240 may be rotatable or non-rotatable relative to the rod 210. The fast pin 240 is made of bronze, for example.

When alternating electric fields similar to the alternating electric fields used in the Embodiment 1 are applied to the piezo drive system 200 of the present embodiment, the disk portion 234 of the rotor 230 preloaded by the fast pin 240 makes a surface contact with the vamplate portion 216 of the rod 210. The rotor 230 rotates away from the rod 210. Because the rotor 230 rotates as described so far, a driving force can be taken from the cylindrical portion 232 in the same way as the conventional electromagnetic motor. According to the present embodiment, it is possible to preload the rotor near the axis of the rod 210. Therefore, there is the advantage that efficient rotation is enabled. The Embodiment 2 is similar to the Embodiment 1 in other typical effects.

Modifications of the present invention are next described. In the modifications described below, the piezo drive systems are similar in configuration with the piezo drive system 200 except for their rotors.

Referring to FIGS. 10A and 10B, a piezo drive system 250 includes a rotor 252 in which a cylindrical portion 254 and a pinion gear 256 are formed continuously. The front portion 218 of the rod 210 is received in the hollow portion 258 within the cylindrical portion 254. A catching part 255 capable of engaging the head portion of the fast pin 240 via the elastic body 246 is formed on the inner surface of the hollow portion 258. In the present example, the bottom surface portion 257 of the pinion gear 256 makes a surface contact with the vamplate portion 216 of the rod 210, thus rotating the rotor 252. Rotation can be outputted to a direction perpendicular to the axis of vibrations from the pinion gear 256 with a combination with a rack gear (not shown).

Referring to FIGS. 11A and 11B, a piezo drive system 250A includes a rotor 252A made up of a cylindrical portion 254A and a pinion gear 256A. The length of the pinion gear 256A is so set that it covers most of the rod 210. Hollow portions 258A and 260 are formed in succession inside the pinion gear 256A. The boundary 262 between the hollow portions 258A and 260 makes a surface contact with the vamplate portion 216 of the rod 210. Consequently, rotation can be taken from the pinion gear 256A to a direction perpendicular to the axis of vibrations.

Referring to FIGS. 12A and 12B, a piezo drive system 280 includes a rotor 282 in which a cylindrical portion 284 and a worm gear 286 are formed continuously. The front portion 218 of the rod 210 is received in the hollow portion 288 within the cylindrical portion 284. A catching part 285 capable of engaging the head portion of the fast pin 240 via the elastic body 246 is formed on the inner surface of the hollow portion 288. In the present example, the bottom surface portion 287 of the worm gear 286 makes a surface contact with the vamplate portion 216 of the rod 210, thus rotating the rotor 282. A driving force can be taken from the worm gear 286 along the direction of the axis of vibrations.

Referring to FIGS. 13A and 13B, a piezo drive system 280A includes a rotor 282A composed of a cylindrical portion 284A and a worm gear 286A. The length of the worm gear 286A is so set that it covers most of the rotor 210. Hollow portions 288A and 290 are formed continuously inside the worm gear 286A. The boundary 292 between the hollow portions 288A and 290 makes a surface contact with the vamplate portion 216 of the rod 210. In consequence, a driving force along the direction of the axis of vibrations can be taken from the worm gear 286A with a combination with a rack gear (not shown).

Embodiment 4

Embodiment 4 of the present invention is next described by referring to FIGS. 14A-15B. The present embodiment is an application of Embodiment 2 described previously. In the configuration of the present embodiment, preloading is done using a ball. FIG. 14A is a side elevation of a piezo drive system of the present embodiment. FIGS. 14A, 15A, and 15B show modifications of the present embodiment. An example shown in FIG. 14A is first described. A piezo drive system 300 includes a fixed frame 302, a drive element 30, a rod 40, a rotor 110, and a ball 118. The fixed frame 302 has a bottom surface portion 304 for holding the drive element 30, a top surface portion 306, and a side surface portion 308, and is shaped like the letter U. The frame 302 is made of an elastic material. The rotor 110 has a cylindrical portion 112. The ball 118 is held between the cylindrical portion 112 and the top surface portion 306. In the present embodiment, the top surface portion 306 is made thinner than the bottom surface portion 304 and side surface portion 308. The top surface portion 306 is so tilted that the line normal to the top surface portion 306 intersects the axis of the rod 40 at an angle α of less than 5°. The drive element 30, rod 40, rotor 110, and ball 118 are similar in configuration to their counterparts of the above-described Embodiment 2. The piezo drive system 300 of the present embodiment is basically the same in drive principle with the piezo drive system of the Embodiment 2. In the present embodiment, however, the top surface portion 306 of the fixed frame 302 is tilted by an angle of less than 5° and so the rotor 110 rotates smoothly. The bottom surface portion 304 and side surface portion 308 are made thicker than the top surface portion 306. Therefore, the bottom surface of the element that forms a pivot of a cantilever can be secured more firmly. As a result, the rod 40 is displaced to a greater extent. Consequently, deterioration of the properties can be suppressed or the properties can be improved.

In the example shown in FIG. 14B, a piezo drive system 300A is the piezo drive system 100A (see FIG. 7C) to which the fixed frame 302 is applied, the piezo drive system 100A being a modification of the Embodiment 2. The tilted top surface portion 306 preloads the rotor 110A via the ball 118. Under this condition, the rotor 110A is rotated. The rotor 110A has a cylindrical portion 112A and a pinion gear 114A. The length of the pinion gear is so set that it covers most of the rod 40. Rotation can be taken from the pinion gear 114A to a direction perpendicular to the axis of vibrations.

Referring to FIG. 15A, a piezo drive system 310 is the piezo drive system 120 (see FIG. 8A) to which the fixed frame 302 is applied, the piezo drive system 120 being a modification of the Embodiment 2. A driving force along the direction of the axis of vibrations can be taken out by rotation of the worm gear 126.

Referring to FIG. 15B, a piezo drive system 310A is the piezo drive system 120A (see FIG. 8B) to which the fixed frame 302 is applied, the piezo drive system 120A being a modification of the Embodiment 2. A driving force along the direction of the axis of vibrations is taken from the worm gear 126A by rotation of the rotor 122A. The length of the gear 126A is so set that it covers most of the rod 40.

Embodiment 5

Embodiment 5 of the present invention is next described by referring to FIGS. 16A-17B. FIG. 16A is a perspective view of a piezo drive system according to Embodiment 5, showing the outer appearance of the piezo drive system. FIG. 16B is a side elevation as viewed in the direction of arrow F16 of FIG. 16A. FIG. 16C is a plan view of the top surface of a fixed frame. FIGS. 16D-1 and 16D-2 are a perspective view and a plan view, respectively, of a piezo drive system according to a modification. FIG. 17A is a perspective view of a piezo drive system according to a further modification, showing the outer appearance of the piezo drive system. FIG. 17B is a side elevation as viewed from the direction of arrow F17 of FIG. 17A.

A piezo drive system 350 of the present embodiment includes a fixed frame 352, a drive element 30, a rod 40, and a rotor 50. The components are similar to their counterparts of the Embodiment 1 except for the fixed frame 352. The frame 352 is shaped like the letter U by a bottom surface portion 354 holding the drive element 30, a top surface portion, and a side surface portion 360. The top surface portion is made of substantially parallel arms 356A, 356B of one pair. In other words, the top surface portion of the fixed frame 352 is divided into the arms 356A and 356B of one pair by a groove 357 through which the cylindrical portion 52 of the rotor 50 extends.

Curved parts 358A and 358B of almost semicircular cross section are formed around the centers of the arms 356A and 356B, respectively. Central portions of the curved parts 358A and 358B make contact with the vamplate portion 46 of the rotor 50. At this time, as indicated by the broken lines in FIG. 16C, the curved parts 358A and 358B provide lines in contact with the vamplate portion 46. The fixed frame 352 designed in this way is made of an elastic material in the same way as in the Embodiment 1. The arms 356A and 356B are made thinner than the bottom surface portion 354. According to the present embodiment, the groove 357 is formed between the arms 356A and 356B of the top surface. Therefore, it is easy to assemble the piezo drive system 350. Embodiment 5 is similar to the Embodiment 1 in other operations and advantages.

As shown in FIGS. 16D-1 and 16D-2, substantially hemispherical protrusions 362A and 362B may be formed on the rear surfaces of the arms 356A and 356B of one pair. As shown in FIG. 16D-2, the vertices of the protrusions make point contact with the vamplate portion 46 of the rotor 50, thus preloading it.

A piezo drive system 380 according to a modification is next described by referring to FIG. 17. The piezo drive system 380 is the piezo drive system 350 (shown in FIGS. 16A and 16B) to which an auxiliary frame 382 for adjustment of the preload is mounted. The auxiliary frame 382 is shaped like the letter L by a bottom surface portion 384, arms 386A, 386B of one pair, and a side surface portion 390. The side surface portion 390 is disposed opposite to the side surface portion 360 of the fixed frame 352. Pawls 388A and 388B engaging parts of curved parts 358A and 358B, respectively, of the frame 352 are mounted at the front ends of the arms 386A and 386B, respectively, of one pair. The auxiliary frame 382 designed in this way may be made of an elastic material in the same way as the fixed frame 352. The frame 382 may also be made of a non-elastic material. When the auxiliary frame 382 is mounted to the fixed frame 352 such that the pawls 388A and 388B engage the curved parts 358A and 358B of the frame 352, the preload applied to the vamplate portion 46 of the rotor 50 by the curved parts 358A and 358B can be adjusted by the auxiliary frame 382. The preload can be adjusted to any desired extent by varying the height of the arms 386A and 386B of the auxiliary frame 382.

Embodiment 6

Embodiment 6 of the present invention is next described by referring to FIGS. 18-23C. In the above Embodiments 1-5, it has been shown that small-sized motors which are simple in structure, produce retaining force by static friction between the rotor and the vamplate portion if the motor is not driven, produce high revolution speed and large torque, and provide high versatility can be accomplished such as the Embodiment 1 shown in FIGS. 6A and 6B. In the present embodiment, the rod of the stator vibrator has been designed according to the required driving properties of motor (e.g., emphasis is placed on rotation or on torque). The stator vibrator is a structure having a piezo drive system to which a rod is mounted as shown in the Embodiment 1.

In the present embodiment, with respect to the properties of the stator vibrator (piezo element 30 and rod 210) and piezo drive system 200, the dimensions of various portions of the stator vibrator shown in FIG. 18 were varied within the ranges given in the following Table 2. The stator vibrator is of the same structure as the stator vibrator shown in FIGS. 9A and 9B. The correlations of the dimensions have been discussed. Underlined numerical values in the Table 2 indicate typical dimensions. The measurements were made using all the typical dimensions except for one dimension varied.

TABLE 2

| | dimension *[1] (mm) | | |
|---|---|---|---|
| rod | height of front portion | $h_u$ | 0.5-3-4 |
| | height of shaft portion | $h_s$ | 0.5-3.5-10 |
| | thickness of vamplate portion | $t_v$ | 0.1-0.5-1 |
| | thickness of bottom plate | $t_b$ | 0.1-0.5-1 |
| | radius of shaft portion | $r_s$ | 0.4-0.7-2.5 |
| | radius of vamplate portion | $r_v$ | 0.7-1.25-2.5 |
| | radius of bottom plate | $r_b$ | 0.7-1.1-2 |
| piezo element | width | w | 1-2.5-4 |
| | thickness | $t_s$ | 0.2-1-2 |

*[1] underlined numerical values are typical dimensions

Resonant frequency $f_0$ and electromechanical coupling coefficient $k_{vn}$ were selected as items of the stator vibrator to be evaluated. The resonant frequency $f_0$ and antiresonant frequency $f_a$ were found from the frequency characteristics of the impedance. Then, the electromechanical coupling coefficient $k_{vn}$ was calculated, using the following Eq. (1).

$$k_{vn} = \sqrt{\frac{f_a^2 - f_0^2}{f_a^2}} \quad (1)$$

Maximum revolution speed $\Omega_0$, maximum torque $T_0$, and output density (output electrode per unit mass) p were selected as items of motor properties to be evaluated. It is desired to increase the output density p as much as possible. Let M be the mass. After finding the maximum revolution speed $\Omega_0$ and maximum torque $T_0$, the output density p was calculated from the following Eq. (2).

$$p = \frac{T_0 \Omega_0}{4M} \quad (2)$$

Numerous parameters including the height $h_t$ of the front portion of the rod 210, the height $h_s$ of the shaft portion, the thickness $t_v$ of the vamplate portion, the thickness $t_b$ of the bottom plate, the radius $r_s$ of the shaft portion, the radius $r_v$ of the vamplate portion, the radius $r_b$ of the bottom plate, the width w of the piezo element 30, and the thickness $t_s$ of the piezo element are shown in Table 2. The results of examinations about the height $h_s$ of the shaft portion of the rod, the radius $r_s$ of the shaft portion, and the radius $r_v$ of the vamplate portion which show high correlation with the motor properties as shown in the following Table 3 summarizing the results of examinations are shown in FIGS. 19A-21C. FIGS. 19A-19C show the results regarding the height $h_s$ (in mm) of the shaft portion. FIGS. 20A-20C show the results regarding the radius $r_s$ (in mm) of the shaft portion and the radius $r_v$ (in mm) of the vamplate portion. In FIGS. 19A, 20A, and 21A, the left side of the vertical axis indicates the resonant frequency $f_0$ in kHz. The right side of the vertical axis indicates the electromechanical coupling coefficient $k_{vn}$. In FIGS. 19B, 20B, and 21B, the left side of the vertical axis indicates the maximum revolution speed $\Omega_0$ (relative value). The right side indicates the maximum torque $T_0$ (relative value). In FIGS. 19C, 20C, and 21C, the vertical axis indicates the output density p (relative value).

TABLE 3

| | dimension *[1] (mm) | | | characteristics of stator vibrator |
|---|---|---|---|---|
| rod | height of front portion | $h_u$ | 0.5-3-4 | decreases monotonously with increasing $h_s$ and hence should be reduced |
| | height of shaft portion | $h_s$ | 0.5-3.5-10 | control factor |
| | thickness of vamplate portion | $t_v$ | 0.1-0.5-1 | small effects |
| | thickness of bottom plate | $t_b$ | 0.1-0.5-1 | |
| | radius of shaft portion | $r_s$ | 0.4-0.7-2.5 | control factors |
| | radius of vamplate portion | $r_v$ | 0.7-1.25-2.5 | |
| | radius of bottom plate | $r_b$ | 0.7-1.1-2 | small effects |
| piezo element | width | w | 1-2.5-4 | stable at typical dimensions and |
| | thickness | $t_s$ | 0.2-1-2 | small effects |

*[1] underlined numerical values are typical dimensions

With respect to the results regarding the height $h_s$ of the shaft portion shown in FIGS. 19A-19C, it can be seen that torque was increased by setting it smaller than the typical dimension (indicia surrounded by the broken lines) Furthermore, as shown in FIGS. 20A-20C, it has been confirmed that the characteristics were stable when the radius $r_s$ of the shaft portion was a half of the width w of the element. Because the typical dimension of the width w of the element is 2.5 mm, a half of the width w of the element is 1.25 mm. In addition, it can be seen that when the radius $r_v$ of the vamplate portion was increased as shown in FIGS. 21A-21C, the revolution speed decreased and the torque increased linearly and that when the radius $r_v$ of the vamplate portion was reduced conversely, the revolution speed increased and the torque decreased linearly.

It has been confirmed from these results that the height $h_s$ of the shaft portion of the rod 210, the radius $r_s$ of the shaft portion, and the radius $r_v$ of the vamplate portion are control factors for the motor properties as shown in Table 3 and that the properties of the motor (piezo drive system 200) can be optimized by setting their values as listed in Table 4 below. In addition, the motor properties can be designed according to the purpose such as revolution speed-oriented type or torque-oriented type.

TABLE 4

| | dimension (mm) | | guidelines |
|---|---|---|---|
| rod | height of front portion | $h_u$ | It suffices to hold revolution of rotor. |
| | height of shaft portion | $h_s$ | w/2.5 to w/2 |
| | thickness of vamplate portion | $t_v$ | small effects |
| | thickness of bottom plate | $t_b$ | |
| | radius of shaft portion | $r_s$ | characteristic curve is peaked at w/2 |

TABLE 4-continued

| | | dimension (mm) | | guidelines |
|---|---|---|---|---|
| | radius of vamplate portion | | $r_v$ | emphasis is placed on rotation or torque near w/2 |
| | radius of bottom plate | | $r_b$ | stable if greater than w/2.5 |
| piezo element | width thickness | | w $t_s$ | w is used as a reference w/2.5 to w/2 or more |

The parameters other than the radius $r_v$ of the vamplate portion were set to the dimensions listed in the following Table 5 based on the aforementioned results of the examinations. Motors with various values of the radius $r_v$ of the vamplate portion were prototyped, and the relationship between the motor properties and the radius $r_v$ of the vamplate portion was examined. Each motor having the front portion 218 whose height $h_u$ is 3 mm is referred to as a sample A, the front portion being closer to the front end than the vamplate portion 216 of the rod 210. Each motor having the front portion 218 whose height $h_u$ is 1 mm is referred to as a sample B. Examinations were performed for these two kinds of samples as shown in Table 5.

TABLE 5

| | dimension *1 (mm) | | A | B |
|---|---|---|---|---|
| rod | height of front portion | $h_u$ | 3 | 1 |
| | height of shaft portion | $h_s$ | 3.5 | |
| | thickness of vamplate portion | $t_v$ | 0.5 | |
| | thickness of bottom plate | $t_b$ | 0.5 | |
| | radius of shaft portion | $r_s$ | 1.25 | |
| | radius of vamplate portion | $r_v$ | 1.25-2.5 | |
| | radius of bottom plate | $r_b$ | 1.25 | |
| piezo element | width | w | 2.5 | |
| | thickness | $t_s$ | 1 | |

*1 underlined numerical values are typical dimensions

The results of evaluations indicating the relationship between motor properties and the radius $r_v$ of the vamplate portion are shown in FIGS. 22A-23C. FIGS. 22A-22C show the results regarding the case where the height $h_u$ of the front portion is 3 mm. FIGS. 23A-23C show the results regarding the case where the height $h_u$ of the front portion is 1 mm. In FIGS. 22A and 23A, the left side of the vertical axis indicates the resonant frequency $f_0$ in kHz. The right side of the vertical axis indicates the electromechanical coupling coefficient $k_{vn}$. In FIGS. 22B and 23B, the left side of the vertical axis indicates the maximum revolution speed $\Omega_0$ (relative value). The right side indicates the maximum torque $T_0$ (relative value). In FIGS. 22C and 23C, the vertical axis indicates the output density p (relative value). It has been confirmed that for the motors of types A and B, the motors can be designed in terms of the radius $r_v$ of the vamplate portion according to the purpose (i.e., whether the motor is a revolution speed-oriented type or a torque-oriented type). It has been confirmed that for the motors of sample A having the front portion whose height was 3 mm, the revolution speed was improved by a factor of 1.5 and the torque was improved by a factor of 4 compared with the motor with the typical dimensions. For the motors of sample B having the front portion whose height was 1 mm, the revolution speed was improved by a factor of 2.3 and the torque was improved by a factor of 4. Furthermore, it has been confirmed that the total height of the motor could be reduced to 6.5 mm. In this way, according to the present embodiment, a small-sized piezo drive system that has high versatility, excellent driving properties, and characteristics capable of being controlled according to the purpose can be offered by setting the dimensions of the rod 210 to appropriate values.

It is to be understood that the present invention is not limited to the above embodiments. Rather, the skilled artisan would appreciate various changes and modifications without departing from the gist of the present invention based on the present disclosure. For example, the invention embraces the following:

(1) The materials, shapes, and dimensions shown in the above embodiments are merely examples. Appropriate variations can be made so as to yield the same or similar advantages. For example, the elastic body 246 of the Embodiment 3 may be inwardly tapered as illustrated as an elastic body 246' in FIG. 26 wherein the numerals denote the same as in FIG. 9B. In this embodiment, due to the tapered surface, the centering of the elastic body 246' is easy, and friction between an inner wall of the cylindrical portion 232 is reduced.

(2) The arrangement of the internal electrodes and external electrodes and the number of division shown in the Embodiment 1 are merely examples. The design may be appropriately modified so as to yield the same or similar advantages. For example, in the Embodiment 1, the four regions are formed. If necessary, more distributions may be formed as illustrated in FIG. 27 where electrode EA' and electrodes EB' are alternately arranged.

(3) The multilayered structure of the multilayered type drive element (piezo element) and the structure of the extension portions of the electrodes are merely examples. If necessary, their structures may be appropriately modified. For example, the structures shown in JP J2007-215395 can be employed in an embodiment, the disclosure of which is herein incorporated by reference in its entirety with respect to the structures.

(4) The piezo drive systems of the above embodiments are merely examples. The present invention can be generally applied to techniques for driving lenses incorporated in optical devices (such as the photographing lens of a camera, a projector lens included in an overhead projector, lenses in binoculars, and lenses in a copier) or in machines including a driven portion such as a plotter or X-Y driving table.

According to the present invention, a vamplate portion is formed on the outer surface of a rod whose one end is secured to a face of a piezo drive element. A rotor making a surface contact with the vamplate portion is preloaded by a preload mechanism. The single piezo drive element causes the rod to produce a torque, thus rotationally driving the rotor. This structure can be adapted for applications of a driving unit that need excellent driving properties and high versatility. Especially, the structure is well suited for ultrasonic motors and other driving unit which require decreases in size, weight, and thickness. In addition, the structure is well suited to cases where properties are preferably controlled according to the intended purpose.

The present application claims priority to Japanese Patent Application No. 2007-291385, filed Nov. 8, 2007, and No. 2008-203657, filed Aug. 6, 2008, the disclosure of each of which is incorporated herein by reference in its entirety including the full scope of the original claims of the above applications.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A piezo drive system comprising:
   a piezo drive element having a first face and a second face opposite to the first face;
   a rod having one end secured to the first face of the piezo drive element, the rod having a shaft portion extending upwardly, the shaft portion having an outer surface having a vamplate portion, the shaft portion having a front portion located closer to a front end of the rod than is the vamplate portion;
   a rotor into which the front portion of the shaft portion can be inserted, the rotor making a surface contact with the vamplate portion, the rotor being capable of rotating relative to the rod; and
   a preloading unit for pushing the rotor against the vamplate portion of the rod;
   wherein the piezo drive element causes the rod to produce a torque, thus rotationally driving the rotor.

2. A piezo drive system as set forth in claim 1, wherein said front portion of the rod rotates about its axial center.

3. A piezo drive system as set forth in claim 1, wherein said rotor includes a body of rotor through which said front portion of the shaft portion of the rod than the vamplate portion can extend and a hollow cylindrical portion formed continuously with the body of rotor, the body of rotor having a flat surface capable of making a contact with a flat surface of the vamplate portion of the rod, and wherein said front portion of the shaft portion of the rod than the vamplate portion can be inserted into the hollow cylindrical portion.

4. A piezo drive system as set forth in claim 3, wherein said preloading unit comprises:
   an elastic fixing frame whose longitudinal cross section is shaped like a letter U by a first surface portion, a second surface portion opposite to the first surface portion, and a side surface portion interconnecting the first and second surface portions; and
   a plurality of protrusions regularly spaced from each other on a lower side of the second surface portion such that the second face of the piezo drive element is secured to an upper surface of the first surface portion and that the flat surface of the body of rotor is pressed against the flat surface of the vamplate portion of the rod by elastic force of the fixing frame.

5. A piezo drive system as set forth in claim 4, wherein said second surface portion is divided into arms of one pair by a groove through which the cylindrical portion of the rotor can extend, the arms supporting opposite sides of the cylindrical portion, and wherein said protrusions are formed on the arms, respectively.

6. A piezo drive system as set forth in claim 4, wherein there is further provided a preload-adjusting frame shaped like a letter L or U and having portions located outside the first and second surface portions of the fixing frame, the first and second surface portions of the fixing frame being capable of being held between said portions of the preload-adjusting frame, and wherein the preload-adjusting frame touches or engages the second surface portion or the arms of one pair to adjust pressure applied by the fixing frame.

7. A piezo drive system as set forth in claim 4, wherein said protrusions provide points or lines in contact with the flat surface of said body of rotor.

8. A piezo drive system as set forth in claim 3,
   wherein said front portion of the shaft portion of the rod located closer to the front end than the vamplate portion is set shorter than the cylindrical portion of the rotor, and
   wherein said preloading unit includes: an elastic fixing frame whose longitudinal cross section is shaped like a letter U by a first surface portion, a second surface portion opposite to the first surface portion, and a side surface portion interconnecting the first and second surface portions; and a ball-like body disposed in the center of an underside of the second surface portion such that the second face of the piezoelectric drive device is secured to an upper surface of the first surface portion and that the flat surface of the body of rotor is pressed against the flat surface of the vamplate portion of the rod by elastic force of the fixing frame, the ball-like portion having a surface portion fitted into the front end of the cylindrical portion, the ball-like portion pushing against the rotor.

9. A piezo drive system as set forth in claim 8, wherein said second surface portion is so tilted that an angle made between a line normal to the second surface portion of the fixing frame and an axis of the rod is less than 5°.

10. A piezo drive system as set forth in claim 4, wherein the second surface portion of said fixing frame is thinner than any other portions of the fixing frame.

11. A piezo drive system as set forth in claim 3,
    wherein said front portion of the shaft portion of the rod located closer to the front end than the vamplate portion is set shorter than the cylindrical portion of the rotor, and
    wherein said preloading units includes: a fixing frame secured to the second face of the piezo drive element; an engagement hole formed near the front end of the rod and extending axially of the rod; a fast pin having a shaft portion capable of fitting into the engagement hole and a head portion capable of being received in the cylindrical portion of the rotor; catching parts protruding from an inner surface of the cylindrical portion of the rotor, permitting the shaft portion of the fast pin to extend through the catching parts, and being capable of engaging the head portion of the fast pin; and an elastic body disposed between each of the catching parts and the head portion of the fast pin and pushing against the rotor via the fast pin.

12. A piezo drive system as set forth in claim 1, wherein said piezo drive element has plural regions divided about an origin formed by the center of the element, and wherein adjacent ones of the regions are different in thicknesswise displacement when the piezo drive element is actuated.

13. A piezo drive system as set forth in claim 12, wherein said plural regions are two or four regions shaped symmetrically with respect to the axis of the rod.

14. A piezo drive system as set forth in claim 1, wherein said piezo drive element has a multilayered structure in which piezoelectric substances and plural internal electrodes are alternately stacked on top of each other, and wherein at least some of the internal electrodes are divided into plural parts about an origin formed by the center of the piezo drive element.

15. A piezo drive system as set forth in claim 1, wherein revolution speed or torque is controlled by adjustment of at least one of height of the shaft portion of the rod between each face of the piezo drive element and the vamplate portion, radius of the shaft portion, and radius of the vamplate portion.

16. A piezo drive system as set forth in claim 15, wherein the radius of said shaft portion is set to a half of the width of each face of the piezo drive element.

17. A piezo drive system as set forth in claim 5, wherein said protrusions provide points or lines in contact with the flat surface of said body of rotor.

18. A piezo drive system as set forth in claim 5, wherein the second surface portion of said fixing frame is thinner than any other portions of the fixing frame.

* * * * *